(12) United States Patent  
Henningson

(10) Patent No.: US 7,990,155 B2
(45) Date of Patent: Aug. 2, 2011

(54) HEAVY DUTY BATTERY SYSTEM TESTER AND METHOD

(75) Inventor: Dale B. Henningson, Manti, UT (US)

(73) Assignee: Auto Meter Products, Inc., Sycamore, IL (US)

( * ) Notice: Subject to any disclaimer, the term of this patent is extended or adjusted under 35 U.S.C. 154(b) by 44 days.

(21) Appl. No.: 12/127,918

(22) Filed: May 28, 2008

(65) Prior Publication Data

US 2008/0224710 A1    Sep. 18, 2008

Related U.S. Application Data

(63) Continuation-in-part of application No. 11/116,198, filed on Apr. 28, 2005, now abandoned.

(51) Int. Cl.
*G01N 27/416* (2006.01)

(52) U.S. Cl. .................. 324/429; 324/426; 324/433

(58) Field of Classification Search .................. 324/433, 324/429
See application file for complete search history.

(56) References Cited

U.S. PATENT DOCUMENTS

| | | |
|---|---|---|
| 4,375,672 A | 3/1983 | Kato et al. |
| 4,575,679 A | 3/1986 | Chung et al. |
| 4,602,127 A | 7/1986 | Neely et al. |
| 5,583,440 A | 12/1996 | Bisher |
| 5,916,287 A | 6/1999 | Arjomand et al. |
| 5,982,154 A | 11/1999 | Kanazawa et al. |
| 6,029,512 A | 2/2000 | Suganuma et al. |
| 6,150,793 A | 11/2000 | Lesesky et al. |
| 6,288,549 B1 * | 9/2001 | Chatelain .................. 324/426 |
| 6,316,914 B1 | 11/2001 | Bertness |
| 6,332,113 B1 * | 12/2001 | Bertness ....................... 702/63 |
| 6,351,102 B1 | 2/2002 | Troy |
| 6,359,442 B1 | 3/2002 | Henningson et al. |
| 6,466,025 B1 | 10/2002 | Klang |
| 6,650,120 B2 | 11/2003 | Krampitz |
| 6,718,425 B1 | 4/2004 | Pajakowski et al. |
| 6,747,456 B2 * | 6/2004 | Scott .......................... 324/426 |
| 6,759,843 B2 | 7/2004 | Furlong |
| 6,771,073 B2 | 8/2004 | Henningson et al. |
| 6,777,945 B2 * | 8/2004 | Roberts et al. ............... 324/426 |
| 6,807,469 B2 | 10/2004 | Funkhouser et al. |
| 6,914,413 B2 | 7/2005 | Bertness et al. |
| 6,988,053 B2 | 1/2006 | Namaky |
| 7,474,228 B2 * | 1/2009 | Lockhart et al. .......... 340/636.1 |
| 2003/0038637 A1 | 2/2003 | Bertness et al. |
| 2003/0155772 A1 | 8/2003 | Scherrbacher et al. |
| 2005/0035752 A1 | 2/2005 | Bertness et al. |
| 2005/0212521 A1 | 9/2005 | Bertness |
| 2006/0244456 A1 | 11/2006 | Henningson et al. |

* cited by examiner

*Primary Examiner* — Edward Tso
*Assistant Examiner* — Ramy Ramadan
(74) *Attorney, Agent, or Firm* — Dickstein Shapiro LLP

(57) ABSTRACT

A systematic method and system for testing the charging and starting systems of a vehicle, which requires each individual test to pass before proceeding is provided. In addition, the invention incorporates an improved alternator test that determines whether the alternator belt is slipping using data read using a vehicle data port. Further, the invention provides a battery bank test that correlates the voltage before and after a load is applied to the battery bank to the batteries' conditions. When testing the starter, the oil temperature is read via the vehicle data port, allowing for a determination of whether the current draw is abnormally high.

4 Claims, 25 Drawing Sheets

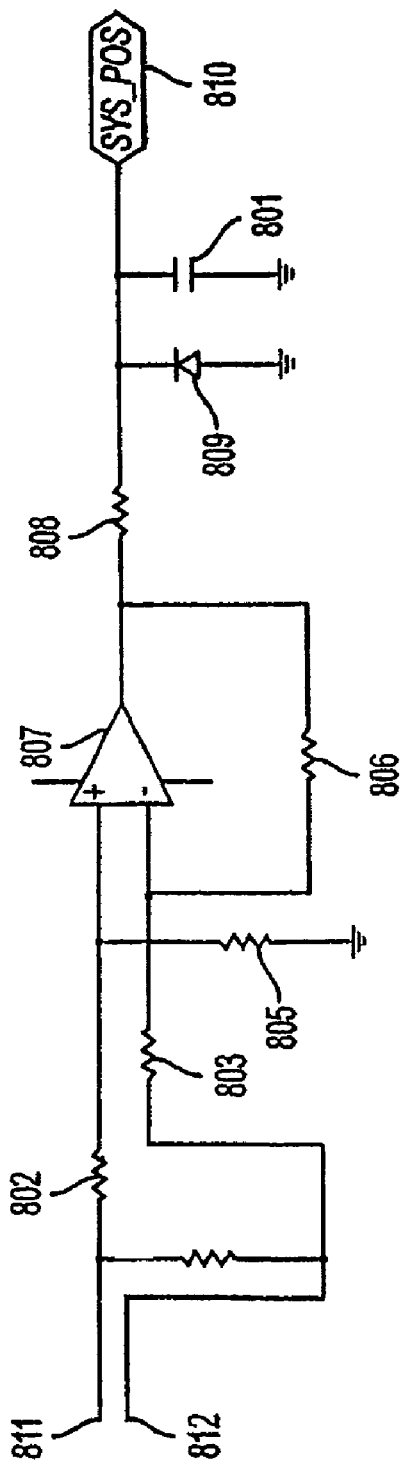
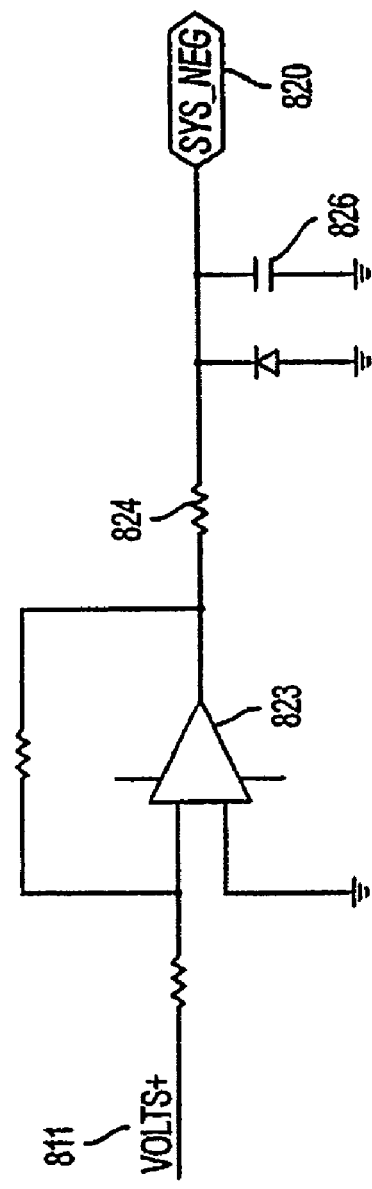
FIG. 3A
FIG. 3B

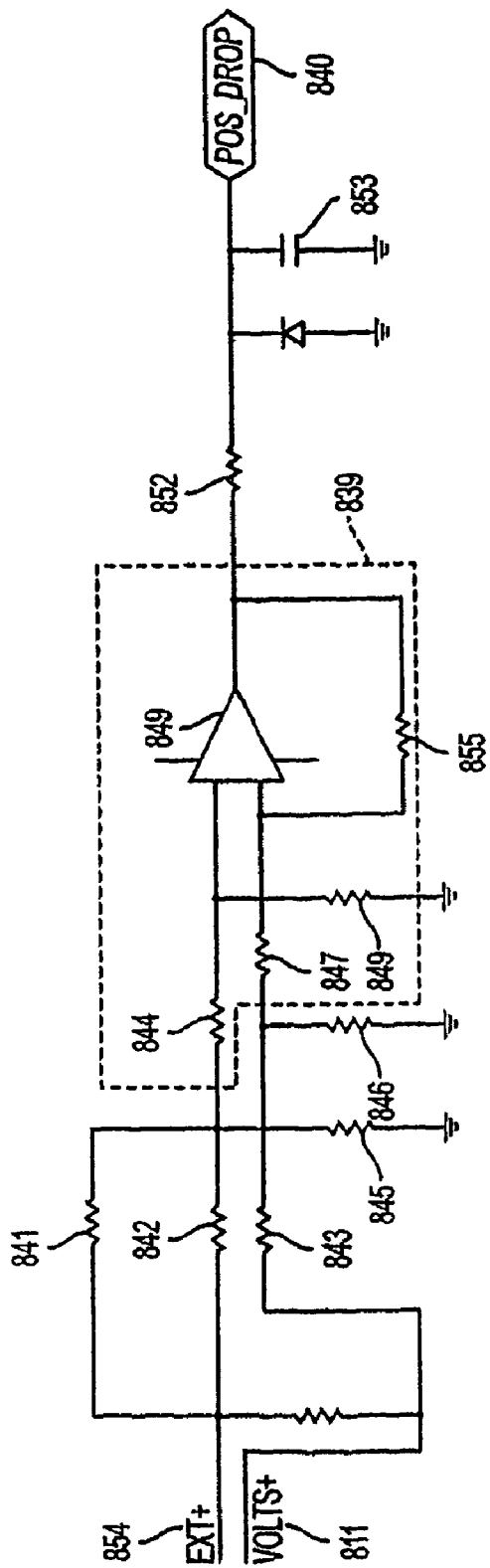
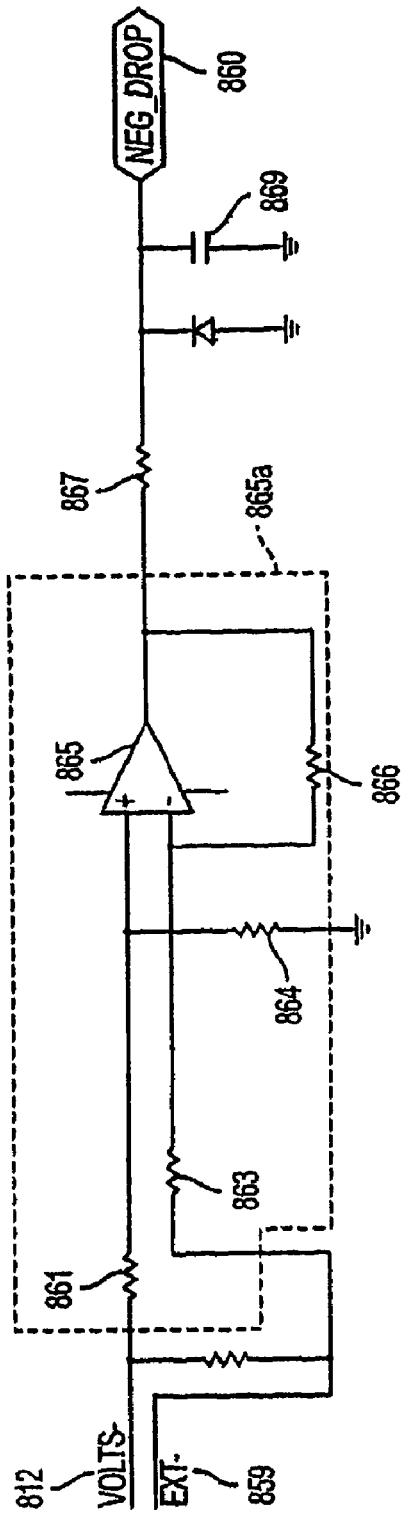
FIG. 3D
FIG. 3E

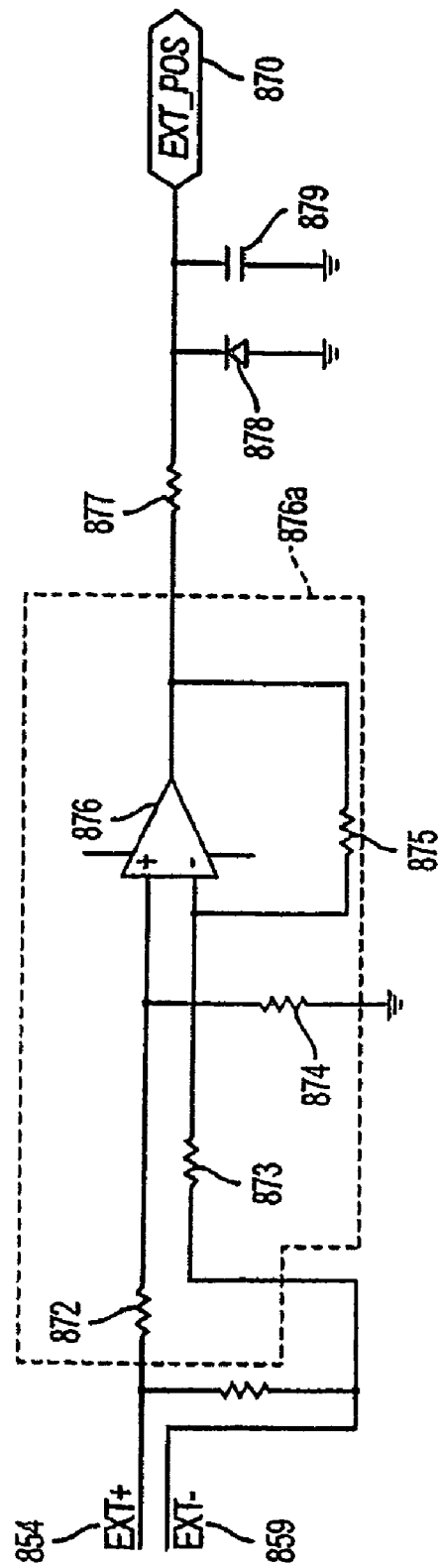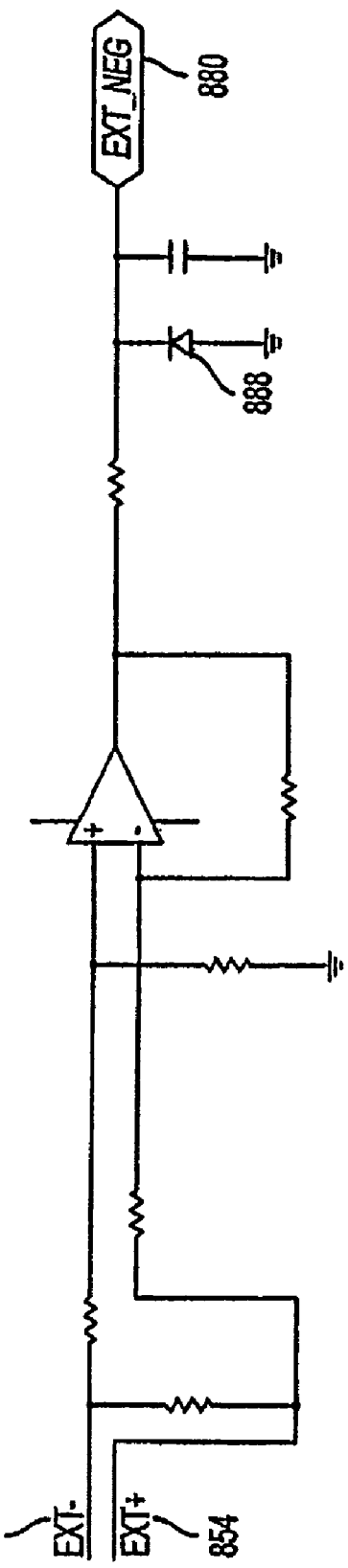
FIG. 3F
FIG. 3G

HEAVY DUTY BATTERY SYSTEM TESTER AND METHOD

This application is a continuation-in-part of U.S. patent application Ser. No. 11/116,198, filed Apr. 28, 2005, now abandoned the entirety of which is hereby incorporated by reference.

BACKGROUND OF THE INVENTION

Traditionally vehicle electrical systems have been tested with a carbon pile variable load tester and a voltmeter. A carbon pile load tester is a variable load tester that utilizes a pile of carbon disks as a resistive load. As the carbon disks are compressed the resistance is decreased and the current through the tester increases. Carbon pile testers are capable of applying a variable load of several hundred amps to a battery or electrical system. To test the batteries on a heavy-duty vehicle with a carbon pile load tester, each battery must be disconnected from the battery bank and tested separately. The tester is connected to the battery posts and the voltage of the battery is read. If the battery voltage is below 12.45 volts, the battery must be charged before proceeding with the test. Once it is determined that the battery has sufficient charge, a load knob on the tester is manually turned by the operator to compress the carbon discs. The carbon disks are compressed until a load of one half the rated cold cranking amps (CCA) is applied to the battery. The load is maintained for 15 seconds. After 15 seconds, the voltage of the battery is noted and the load is removed by uncompressing the carbon disks. The operator then compares the noted voltage to a pass/fail voltage obtained from a chart or graph that compensates for the temperature. Unfortunately, the accuracy of this test is dependent on the skill and care of the operator.

To test the cables and the connections in the charging or starting circuits of a heavy-duty vehicle with a carbon pile load tester, the tester is connected at the alternator or at the starter. The auxiliary voltage leads of the tester (or the leads of a separate voltmeter) are connected to the battery bank. An operator applies and adjusts a load current equal to the rated output of the alternator or the specified current draw of the starter using the variable load tester. While the current flows, the operator notes the voltage at the alternator or starter and the voltage at the battery bank. The voltage drop of the system is calculated by the operator. If the voltage drop exceeds a specified amount (e.g., 0.5 volts), the electrical system is deemed problematic and the operator must determine if the problem is in the positive or the negative leg of the electrical system. This determination is made by reconnecting the auxiliary voltage leads across the positive leg and reapplying the load. The voltage may not exceed a maximum acceptable voltage drop (e.g., 0.25 volts). The voltage may not exceed one half of the maximum acceptable voltage amount (e.g., 0.25 volts). A value exceeding one half of the maximum acceptable voltage indicates a possible defect in the positive leg. Next, the auxiliary voltage leads are connected across negative leg of the system, and the load is again applied and adjusted. The voltage across the negative leg is measured. A value exceeding one half of the maximum acceptable voltage (e.g., 0.25 volts) indicates a possible defect in the negative leg.

Before testing the alternator, the operator should test the battery or batteries, and the cables between the alternator and the battery bank. The operator should make any necessary repairs based on the outcome of these tests. When testing the alternator, the operator connects the load tester to the battery bank and while the vehicle is running, reads the voltage. The alternator should regulate the voltage between approximately 13.2 volts and 14.8 volts on a 12 volt system. If the voltage is not within the specified range, there is a problem with the alternator or the voltage regulator. If the alternator maintains the voltage within the specified range, the operator applies a carbon pile load to the system until the voltage at the batteries is about 12.6 volts. At 12.6 volts the batteries will not be collecting charge or delivering current. At this point, the operator reads the current that the tester is drawing. A DC amplifier probe can also be used to measure the total output of the alternator. If the output of the alternator is within 10% of its rated output, the alternator has passed the test.

Before an operator tests the starter, the battery or batteries, the cables to the starter from the battery bank and the magnetic switch circuit should have previously been tested and repaired. A magnetic switch is a solenoid type relay that energizes the starter solenoid on the starter when the ignition key is turned to the start position. These tests, however, often do not occur. To test the starter, the operator connects the load tester to the battery bank and monitors the voltage as the engine is cranked. The operator then applies a load to the battery bank until the voltage of the battery bank reaches the voltage that was observed while the engine was cranking. At this point, the operator calculates the current that the tester is drawing. A higher than normal current draw is indicative of a bad starter.

More recently automated testers have been introduced that make testing quicker and more reliable. These testers, however, still focus on the components of the system and not the system as a whole. Often alternators and starters that are still good are misdiagnosed and removed because of another problem in the electrical system (i.e., weak batteries, corroded/damaged cables, bad connections, or a loose belt)—this is undesirable. If these alternators and starters are under warranty they are sent back to their manufacturer under a warranty claim. The manufacturer tests the unit. Because the units are still properly fluctioning, the warranty is denied. High costs are incurred in this type of situation. Even after high costs are incurred, the real problem has still not been resolved.

Because many starting and charging electrical problems are progressive, a good preventative maintenance test is needed to catch and correct these problems before they cause a no-start situation. Additionally, a loose alternator belt can prevent an alternator from outputting full current by not turning the alternator at full speed. Current testers have no way of determining whether the inability of the alternator to output is due to belt slippage. Temperature affects the viscosity of engine oil and the amount of current it takes to crank a starter when the oil is cold is higher than when the oil is warm. Therefore, a system and method for testing a charging and starting system for testing the systems as a whole, for testing for alternator slippage and for testing a starter system incorporating the oil temperature is needed.

There exists diagnostic tools that connect to a data port of vehicle; these tools are often referred to as scan tools. Typically, the scan tools stand-alone and do not interface with other test equipment. Presently, J1708 or J1587 and J1939 are the protocols used with the data port. Society of Automotive Engineers (SAE) documents these protocols outline. These scan tools, however, fail to provide methods and/or systems for utilizing oil temperature during a starter test and utilizing the RPM readings in determining alternator slippage.

U.S. Pat. No. 6,650,120 to Bertness et al., U.S. Pat. No. 6,718,425 to Kramptiz, and U.S. Pat. No. 6,777,945 to Pajakowski et al., and U.S. Patent Application Publication No. 2003/0038637 to Bertness et al. describe testing charging and starting system components, but fail to test the charging and/or starting system systematically and connecting to a vehicle data port.

U.S. Pat. No. 4,375,672 to Kato et al., U.S. Pat. No. 6,029,512 to Suganuma, and U.S. Pat. No. 6,466,025 to Klang, and U.S. Application Publication No. 2003/0155772 to Scherrbacher et al. disclose testing alternators to determine whether they are good. However, these references fail to disclose a system for detecting alternator belt slippage where engine RPM is read via a vehicle data port and alternator rotation is read via an R-terminal.

U.S. Pat. No. 5,583,440 to Bisher relates to testing and running AC loads on a backup system. The '440 Bisher patent, however, fails to test a battery or bank of batteries in a vehicle.

U.S. Pat. No. 6,316,914 to Bertness relates to testing a bank of batteries using a current sensor. The '914 Bertness patent, however, fails to disclose testing a bank of batteries without the use of an inter cell current sensor.

U.S. Pat. No. 6,351,102 to Troy discloses a method and system for testing vehicular batteries. The '102 Troy patent, however, fails to disclose a method and system for testing a bank of batteries.

U.S. Pat. No. 6,759,843 to Bertness et al. relates to testing storage batteries. The '843 Bertness patent, however, does not disclose testing a vehicle's bank of batteries.

BRIEF SUMMARY OF THE INVENTION

The invention relates to a systematic method and system for testing the charging and starting systems of a vehicle, which requires each individual test to pass before proceeding. In addition, the invention incorporates an improved alternator test that determines whether the alternator belt is slipping using data read using a vehicle data port. Further, the invention provides a battery bank test that correlates the voltage before and after a load is applied to the battery bank to the batteries' conditions. When testing the starter, the oil temperature is read via the vehicle data port, allowing for a determination of whether the current draw is abnormally high.

In an aspect of the invention, a method for testing a bank of batteries comprises the steps of measuring a voltage of the battery bank is provided, including comparing said measured voltage to a threshold voltage using the cold cranking amps of each battery and temperature; if said measured voltage is greater than said threshold, applying a load to the bank of batteries; measuring the voltage of the bank of batteries while the load is being applied, wherein the voltage change is correlated to the battery bank condition; and determining whether said bank of batteries passes based on said change in voltage.

In another aspect of the invention, a system for testing a bank of batteries of a vehicle comprises a tester apparatus is provided, including a plurality of leads for connecting to said bank of batteries; a data cable for connecting said tester to a vehicle data port; and a circuit for determining the condition of said bank of batteries.

In another aspect of the invention, an apparatus for testing a bank of batteries of a vehicle comprises a plurality of leads for connecting to said bank of batteries is provided, including a data cable for connecting said tester to a vehicle data port; and a circuit for determining the condition of said bank of batteries.

BRIEF DESCRIPTION OF THE DRAWINGS

FIG. 3a is a schematic diagram of a circuit illustrating how a SYS_POS output results from a measurement of a voltage across the load leads depicted in FIG. 1.

FIG. 3b is a schematic diagram of a circuit illustrating how a SYS_NEG output results from a determination that the load leads depicted in FIG. 1 are connected in reverse.

FIG. 3d is a schematic diagram of a circuit illustrating how a POS_DROP output results from a measurement of a voltage drop across a positive leg of an electrical system.

FIG. 3e is a schematic diagram of a circuit illustrating how a NEG_DROP output results from a measurement of a voltage drop across a negative leg of the electrical system.

FIG. 3f is a schematic diagram of a circuit illustrating how an EXT_POS output results from a measurement of a voltage drop across the voltage leads depicted in FIG. 1.

FIG. 3g is a schematic diagram of a circuit illustrating how an EXT_NEG output results from a determination that voltage leads depicted in FIG. 1 are connected in reverse.

DETAILED DESCRIPTION OF THE INVENTION

In the following detailed description, reference is made to the accompanying drawings, which are a part of the specification, and in which is shown by way of illustration various embodiments whereby the invention may be practiced. These embodiments are described in sufficient detail to enable those skilled in the art to make and use the invention. It is to be understood that other embodiments may be utilized, and that structural, logical, and electrical changes, as well as changes in the materials used, may be made without departing from the spirit and scope of the present invention.

The invention relates to a system and method for testing the charging and starting system of a vehicle. The embodiments of the tester may utilize the same or similar hardware as that described in U.S. Pat. No. 6,771,073, assigned to Auto Meter Products, Inc., which is hereby incorporated by reference. As explained below, in the present invention, the RS-232 port used to connect the testing unit 5 to a computer, may also connect to a J1708 data port on the vehicle being tested. RS-232 is a common type of serial communication port used on many products that communicate with a computer. The tester described in U.S. Pat. No. 6,771,073 is modified to include several new features described herein. The preferred embodiment of this invention utilizes the J1708 data port because it is present on new trucks as well as on many older trucks. The J1939 protocol is present on late model trucks only. It should be noted that the test method and processing of the invention is not limited to the protocol used to read the data.

In an effort to save time or because of lack of understanding of the interdependence of the components of the starting or charging system, technicians will often attempt to test the alternator or the starter without testing the batteries or cables first, thereby often misdiagnosing that the problems are in the alternator or starter. The present invention addresses the problem of misdiagnosing the functionality of an alternator or starter by providing a technique to ensure that the entire starter or charging system is systematically tested to find the real problem. Furthermore, the present invention provides improved alternator testing by testing for belt slippage; improved starter testing by reading engine oil temperature and comparing the current draw to the acceptable current draw with the oil at the measured temperature; and quicker battery testing by providing a battery bank test.

Figure 1:
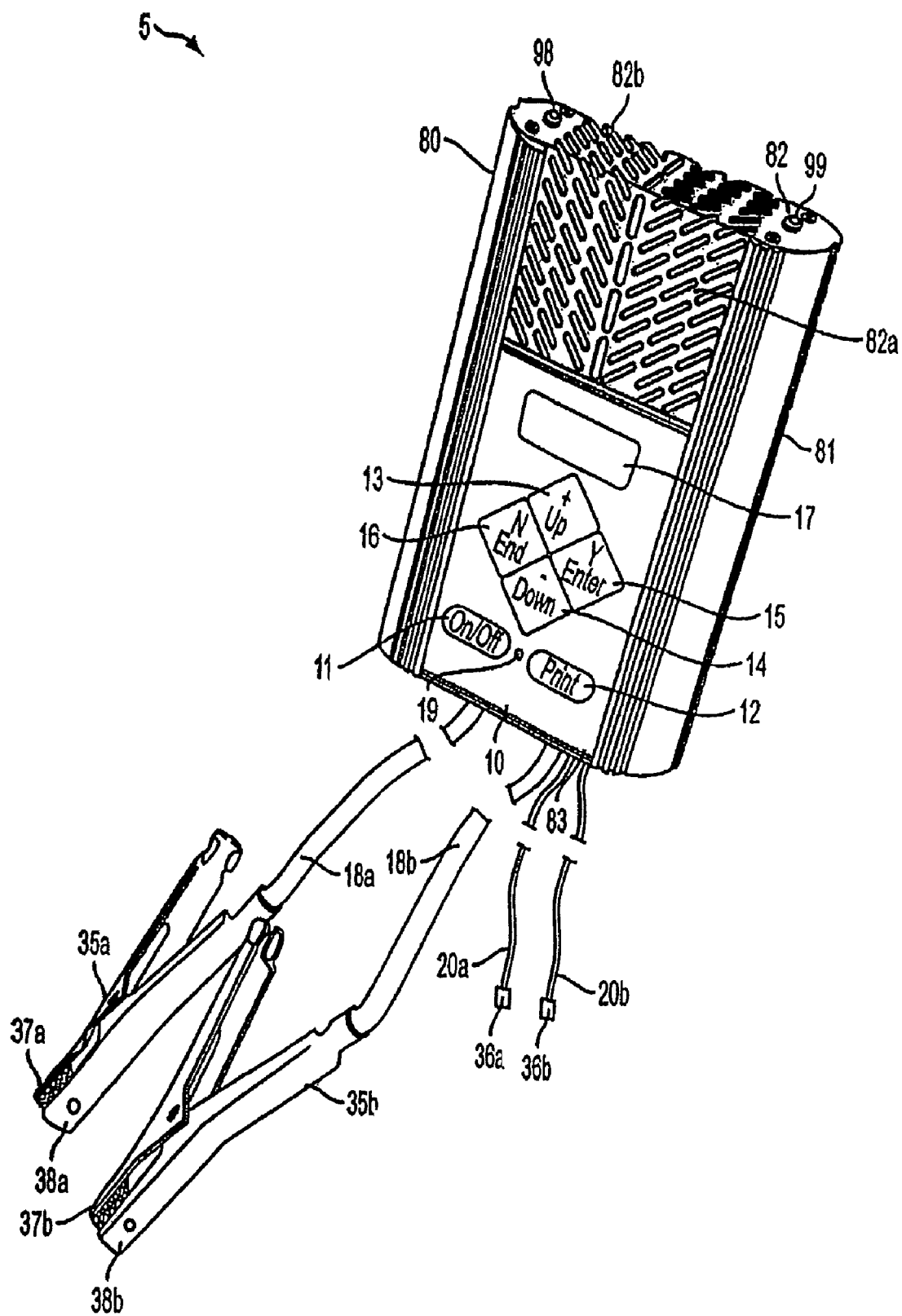
FIG. 1 is a perspective view of an embodiment according to the present invention.

Referring to FIG. 1, a perspective view of a hand-held testing unit 5 embodying principles of embodiments of the present invention is shown. A bottom front panel 10 includes an On/Off key 11, a Print key 12, and a key pad with four manual keys 13-16 used in conjunction with a liquid crystal display (LCD) 17. The four manual keys 13-16 include an +/Up key 13, a −/Down key 14, an Y/Enter key 15, and an N/Esc key 16. The keys 13-16 provide input signals to a microprocessor (not shown) that controls operation of the testing unit 5, including messages and/or data displayed on the LCD 17. A pair of load leads 18a and 18b, with kelvin clamps 35a and 35b, extend from an end of the testing unit 5 for connection to a starter, alternator, or batteries of an electrical system under test (not shown).

Each kelvin clamp 35a, 35b comprises a first jaw 37a, 37b and a second jaw 38a, 38b, for facilitating connection to the electrical system under test. Furthermore, the pair of load leads 18a and 18b includes a positive load lead 18a and a negative load lead 18b. Each load lead of the pair of load leads 18a and 18b also comprise a large conductor (not shown) that carries current when a load is applied and a small conductor (not shown) that is used to measure voltage. The large and small conductors are associated with the first and second jaws, 37a, 37b and 38a, 38b, respectively, of the kelvin clamps 35a and 35b. Additionally, a pair of voltage leads 20a and 20b with clamps 36a and 36b, respectively, extend from the testing unit 5 for connection to a battery (not shown) of the electrical system under test. The pair of voltage leads comprise a positive voltage lead 20a and a negative voltage lead 20b. The remaining components of the testing unit 5 will be described below in connection with FIGS. 8, 9, 11, 21, and 22.

Figure 2:
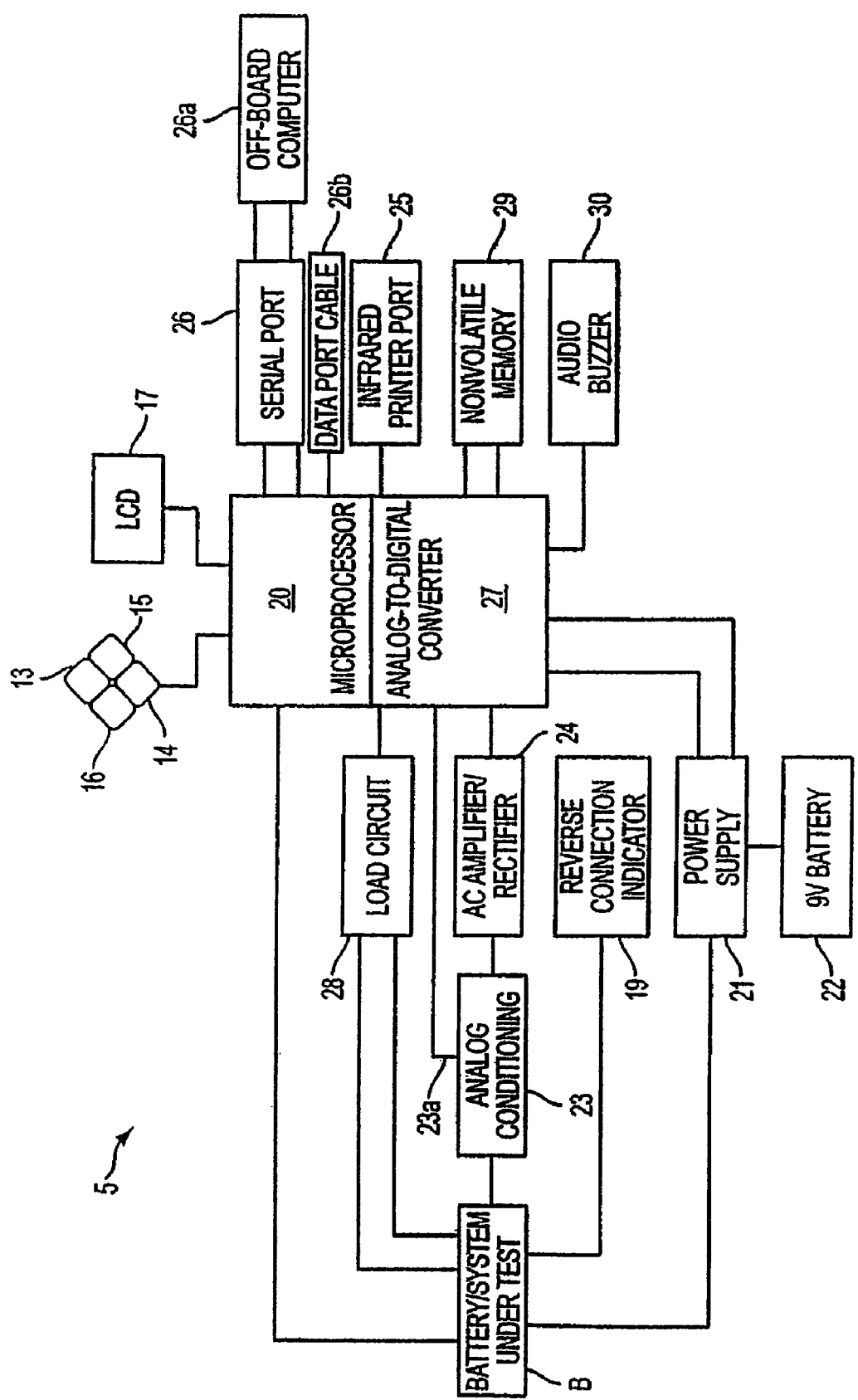
FIG. 2 is a block diagram of the testing unit shown in FIG. 1.

Referring now to FIG. 2 the testing unit 5 is controlled by a microprocessor 20 that receives power from a power supply circuit 21, which in turn is powered by a lead-acid battery/system B under test. A 9-volt battery 22 provides an alternative power source when the testing unit 5 is not connected to the battery B. The microprocessor 20, which also includes an analog-to-digital (A/D) converter 27, receives input signals from the four manual keys 13-16, an analog conditioning circuit 23, and an alternating current (AC) amplifier/rectifier circuit 24, as will be described in more detail below.

The microprocessor 20 provides output signals to a liquid crystal display (LCD) 17 for communicating with a user, an infrared printer port 25 for printing results, to a serial port 26 for communicating with an off-board computer 26a, such as, for example, a personal computer, a load circuit 28 that can be connected to the battery/system B under test, and to an audio buzzer 30 for providing audible alarms or signals. The microprocessor 20 is also connected to a nonvolatile memory 29 for storing and retrieving data that is to be preserved in the event of a loss of power. The microprocessor 20 also receives information from the vehicle data port 266.

In one exemplary embodiment, flash memory maybe used as the nonvolatile memory 29. The use of flash or other removable nonvolatile memory allows for the testing units 5 to be customized for each user's implementation. For example, the batter policy may be stored within the nonvolatile memory 29 so that the technician using the testing unit 5 will not be required to remember the battery policy, thereby decreasing the possibility of human error.

The following description describes one embodiment of circuitry used within testing unit 5. It should be appreciated that the invention is not limited to the value of the resistances, capacitors and other unit-values described. Referring now to FIG. 3a, there is shown a schematic diagram of a circuit illustrating how an output voltage (SYS_POS) 810 results from measurement of a voltage across the load leads 18a and 18b depicted in FIG. 1. The circuit is arranged in a differential amplifier configuration, such that a voltage difference between VOLTS+ 811 and VOLTS− 812 (wherein VOLTS+ 811 and VOLTS− 812 indicate the voltage at the positive and negative load leads 18a and 18b, respectively), preferably with an input range of 0-15.36 volts, produces a gain of less than one. In a desired embodiment, two 187 KΩ resistors 802 and 803, and two 49.9 KΩ resistors 805 and 806 are arranged with an operational amplifier 807 in the differential amplifier configuration to set the gain of the operational amplifier 807. A 2 KΩ resistor 808 is coupled with a 1 microfarad capacitor 801 to form a low-pass filter in order to reduce system noise. A diode 809 is included in the circuit to detect a reverse connection of VOLTS+ 811 and VOLTS− 812 and also to prevent transmission of a voltage below 0.3 Volts to the A/D converter 27 of the microprocessor 20. The SYS_POS output voltage 810 is input into the microprocessor 20.

Referring now to FIG. 3b, there is shown a schematic diagram of a circuit illustrating how a positive output voltage (SYS_NEG) 820 results from a determination that the load leads 18*a* and 18*b* of FIG. 1 have been connected in reverse. An inverting amplifier 823 reads a voltage from VOLTS+ 811 and converts the voltage of VOLTS+ 811 to a positive signal ranging from 0 to 4.096 Volts. This positive signal is filtered by a low pass filter comprising a 2 KΩ resistor 824 and a 1 microfarad capacitor 826. The SYS_NEG output voltage 820 is then sent to the A/D converter 27 (not shown) and an indication of a reversed connection of the load leads 18*a* and 18*b* is displayed on the LCD 17. Thus, the circuit of FIG. 3*b* uses an inverting amplifier 823 to send a positive voltage to the A/D converter 27 if the load leads 18*a* and 18*b* are connected in reverse.

Figure 3C:
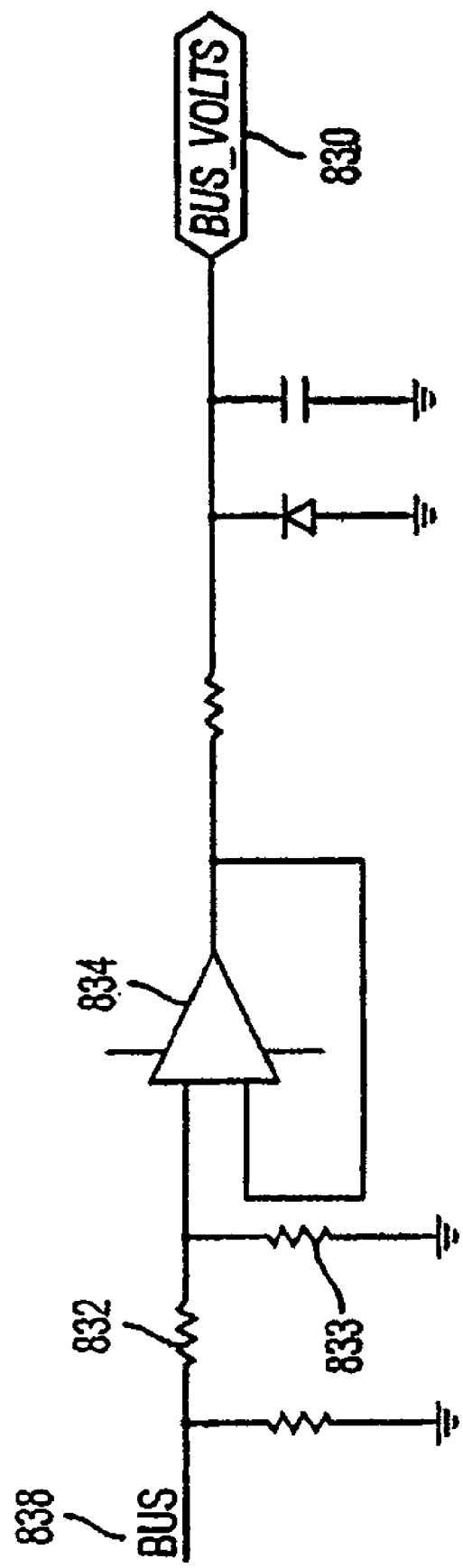
FIG. 3c is a schematic diagram of a circuit illustrating how a BUS_VOLTS output results from a measurement of a voltage across large conductors of the load leads depicted in FIG. 1.

Referring now to FIG. 3*c*, a schematic diagram of a circuit illustrating a measurement of a voltage across the large conductors of the load leads 18*a* and 18*b* resulting in an output voltage (BUS_VOLTS) 830 indicative of a measured voltage across the large conductors is shown. An operational amplifier 834 is arranged in a voltage-follower configuration and a pair of resistors 832 and 833 are arranged to create a voltage divider circuit. The voltage divider/voltage follower combination measures a voltage (BUS+ 838) across the large conductors of the load leads 18*a* and 18*b*.

The microprocessor 20 of FIG. 2 compares the BUS_VOLTS output voltage 830 to the SYS_POS output voltage 810 of FIG. 3*a*, in order to ensure that a proper connection has been made at the load leads 18*a* and 18*b*. A difference between the SYS_POS output voltage 810 and the BUS_VOLTS output voltage 830 that is greater than a value preprogrammed in the microprocessor 20 indicates a poor connection of the kelvin clamps 35*a*, 35*b* shown in FIG. 1.

Referring now to FIG. 3*d*, depicting a schematic diagram of a circuit illustrating how a positive leg output voltage (POS_DROP) 840 results from a measurement of a voltage drop across a positive leg of the electrical system. Two voltage dividers, each preferably comprising a 4.22 KΩ resistor and a 649 KΩ resistor (842/845 and 843/846, respectively) divide input signals EXT+ 854 (a voltage at the positive voltage lead 20*a* of voltage leads 20*a* and 20*b*) and VOLTS+ 811 to an operational amplifier 849, such that input signal EXT+ 854 and input signal VOLTS+ 811 is maintained within a common-mode range of the operational amplifier 849.

The input signals EXT+ 854 and VOLTS+ 811 are then sent through a differential amplifier circuit 839, which includes two 332 KΩ resistors 844 and 847, two 4.99 MΩ resistors 848 and 855, and the operational amplifier 849. The differential amplifier circuit 839 measures a difference between EXT+ 854 (i.e., a voltage at the positive voltage lead 20*a*) and VOLTS+ 811 (i.e., a voltage at the positive load lead 18*a*). Thus, the input signals EXT+ 854 and VOLTS+ 811 are first divided, and then amplified.

A 412 KΩ resistor 841 is incorporated into the circuit to ensure a positive offset by the operational amplifier 849 so that the offset can be calibrated out in software. A signal output by the differential amplifier circuit 839 is then passed through a low-pass filter comprising a 2 KΩ resistor 852 and a 1 microfarad capacitor 853 and the resulting POS_DROP output voltage is transmitted for analysis to the microprocessor 20.

Referring now to FIG. 3*e*, illustrating a schematic diagram of a circuit depicting how a negative leg output voltage (NEG_DROP) 860 results from a measurement of a voltage drop across a negative leg of the electrical system. The difference between VOLTS− 812 (i.e., a voltage at the negative load lead 18*b*) and EXT− 859 (i.e., a voltage at the negative voltage lead 20*b*) is measured. The schematic diagram is configured similarly to that of FIG. 3*d*, however, unlike the schematic diagram of FIG. 3*d*, a voltage divider is unnecessary since both VOLTS− 812 and EXT− 859 inputs are maintained at a value close to ground. The VOLTS− 812 and EXT− 859 are transmitted through a differential amplifier circuit 865*a* comprising two 100 KΩ resistors 861 and 863, two 200 KΩ resistors 864 and 866, and an operational amplifier 865. A signal transmitted through the differential amplifier circuit 865*a* is sent through a low-pass filter, which comprises a 2 KΩ resistor 867 and a 1 microfarad capacitor 869. A NEG_DROP output voltage resulting therefrom is sent to the microprocessor 20.

Referring now to FIG. 3*f*, illustrating a schematic diagram of a circuit depicting how a voltage lead output (EXT_POS) 870 results from a measurement of a voltage drop across the voltage leads 20*a* and 20*b* shown in FIG. 1. In a similar fashion to the schematic diagram illustrated in FIG. 3*a*, the circuit of FIG. 3*f* incorporates a differential amplifier circuit 876*a*, which includes two 187 KΩ resistors 872 and 873, two 49.9 KΩ resistors 874 and 875, and an operational amplifier 876. The differential amplifier circuit 876*a* reads input voltages EXT+ 854 and EXT− 859, which correspond to voltages of the voltage leads 20*a* and 20*b*, respectively, and transmits an output signal. A gain of less than one is produced by the differential amplifier circuit 876*a*. An output signal transmitted by the differential amplifier circuit 876*a* is then sent through a low-pass filter comprising a 2 KΩ resistor 877 and a 1 microfarad capacitor 879. The diode 878 prevents transmission of a voltage of less than 0.3 Volts in the event that the inputs EXT+ 854 and EXT− 859 are connected in reverse. The EXT_POS output voltage 870 is input into the microprocessor 20.

Referring now to FIG. 3*g*, depicting a schematic diagram of a circuit illustrating how a reversely-connected voltage lead output (EXT_NEG) 880 results from a determination that the voltage leads 20*a* and 20*b* of FIG. 1, have been connected in reverse. The schematic diagram of FIG. 3*g* is similar to the circuit illustrated in FIG. 3*f*, with the exception that the EXT+ 854 and EXT− 859 input voltages (i.e., the voltages of the positive and negative voltage leads 20*a* and 20*b*, respectively) are reversed. The reversal of the EXT+ 854 and the EXT− 859 inputs, in combination with a diode 888, allows for detection of a reverse hookup.

Figure 4:
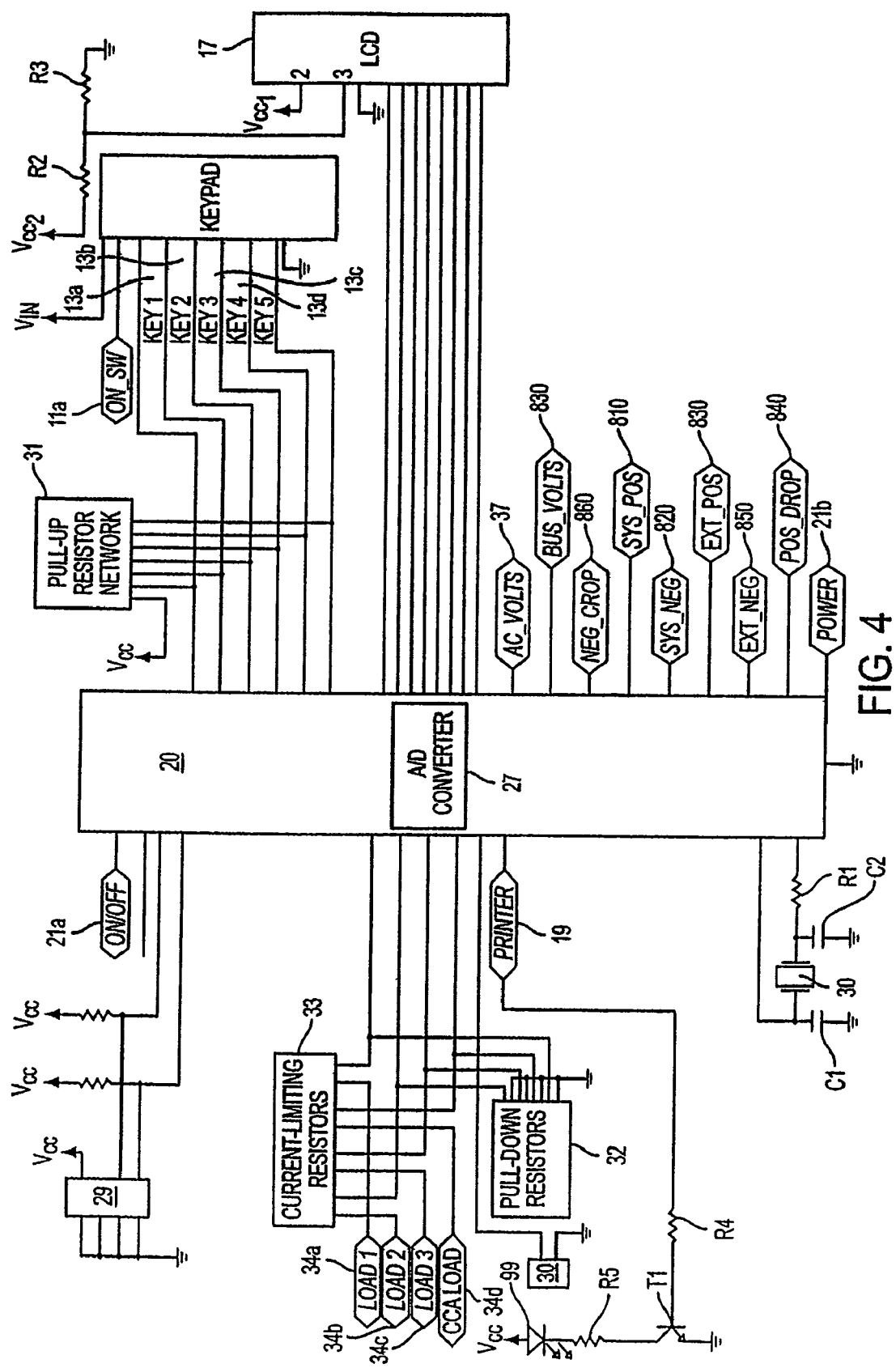
FIG. 4 is a circuit diagram of a portion of the system of FIG. 3, including a microprocessor and its display, keypad and nonvolatile memory.

Referring now to FIG. 4, which illustrates a more detailed diagram of the testing unit 5 shown in FIG. 2. The microprocessor 20, which includes the A/D converter 27, receives an ON/OFF signal 21*a* from the power supply circuit 21 of FIG. 2, an ON_SW signal 11*a* from the On/Off key 11 shown in FIG. 1, KEY 1-4 signals 13*a*-*d* from the four manual keys 13-16 shown in FIG. 1, and a signal from the Print key 12 via a pull-up resistor network 31. Also received by the A/D converter 27 is an AC_VOLTS output 37 from the AC amplifier/rectifier circuit 24, the SYS_POS output voltage 810, which measures the voltage across the load leads 18*a* and 18*b*, the SYS_NEG output voltage 820, the BUS_VOLTS output voltage 830, the POS_DROP output voltage 840, the NEG_DROP output voltage 860, the EXT_POS output voltage 870, the EXT_NEG output voltage 880, and data signals from the non-volatile memory 29. Oscillator signals from an oscillator comprising a crystal 30, a pair of capacitors C1 and C2, and a current-limiting resistor R1, are also input into the A/D converter 27 of the microprocessor 20.

Output signals produced by the microprocessor 20 include: display-generating signals to the LCD 17, which also receives $Vcc_1$ at terminal 2 of the LCD 17 and a reduced $Vcc_2$ at terminal 3 of the LCD 17 to set a LCD contrast (the reduction being achieved by a voltage divider formed by a pair of resistors R2 and R3 connected between $Vcc_2$ and ground, with terminal 3 of the LCD 17 receiving a voltage that exists between resistors R2 and R3); a POWER signal 21b for the power supply circuit 21 shown in FIG. 2; a PRINTER signal 19 for an infrared transducer used to communicate with the printers; switching signals LOAD 1 34a, LOAD2 34b, LOAD3 34c, and CCA_LOAD 34d supplied via pull-down resistors 32 and current-limiting resistors 33, to control Field Effect Transistors (FETs) that connect and disconnect various loads to the battery/system B under test; and data signals to be stored in the non-volatile memory 29.

Coupling to a printer is effected by an infrared coupling diode 99 mounted in an upper end of the testing unit 5 (as also shown in FIG. 1). The PRINTER signal 19 from the microprocessor 20 is supplied via a resistor R4 to the base of a transistor T1. When the transistor T1 is turned on, current flows from a Vcc source through the diode 99, a resistor R5, and the transistor T1 to ground.

Figure 5:
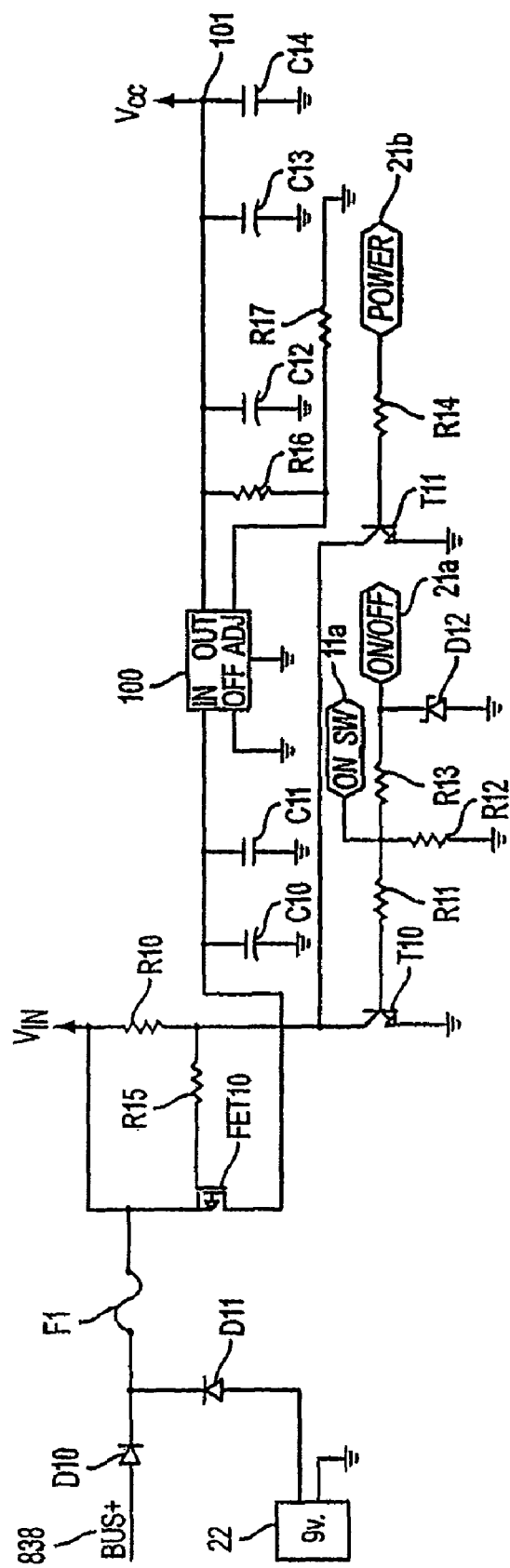
FIG. 5 is a circuit diagram of a power supply circuit used in the testing unit of FIG. 2.

Referring now to FIG. 5, illustrating a circuit diagram that depicts in more detail the power supply circuit 21 shown in FIG. 2. The BUS+input 838 to the power supply circuit is connected to battery/system B under test via the large conductor of the positive load lead 18a, while ground is connected to the large conductor of the negative load lead 18b. The supply current from the BUS+ 838 input (indicative of the voltage across the large conductors of the load leads 18a and 18b) passes through a blocking diode D10 and a resettable fuse F1 that trips under high currents, which resets after a period of time. The diode D10 prevents damage to the testing unit 5 if the load leads 18a and 18b, connected to the battery/system B under test, are connected in reverse. When the load leads 18a and 18b are not connected to the battery/system B under test, the power supply circuit 21 is powered by a 9-volt battery 22 (also shown in FIG. 2) through a blocking diode D11.

The power supply circuit 21 is turned on by the ON_SW signal 11a from the On/Off key 11 (FIG. 1), and then is kept on by the POWER signal 21b (also shown in FIG. 4) output by the microprocessor 20. These signals turn on either switching transistor T10 or switching transistor T11 to draw current through a pull-up resistor R10. Specifically, the ON_SW signal 11a is applied to a base of the switching transistor T10 through a current-limiting resistor R11 and is also supplied to a pull-down resistor R12 connected to ground. An ON/OFF signal 21a (also shown in FIG. 4) connected to the microprocessor 20 is also supplied from the keypad through a second current-limiting resistor R13 and a voltage-limiting zener diode D12, which is connected from the ON/OFF signal 21a to ground. The POWER signal 21b from the microprocessor 20 is supplied to the base of the switching transistor T11 through a current-limiting resistor R14.

A low voltage at a collector of either transistor T10 or T11 turns on FET 10, which then supplies current from the BUS+ input 838 to the input terminal of a voltage-regulating IC 108 to switch on the power. A gate of the FET 10 is protected by a resistor R15, and a pair of filter capacitors C10 and C11 are connected in parallel from the input of IC 108 to ground. The output of the IC 108 is connected to a terminal Vcc₃ which is connected to a conventional voltage converter to furnish −5 volt power throughout the unit. Three filter capacitors C12, C13, and C14 are connected in parallel from the terminal Vcc₃ to ground. A voltage divider is formed by a pair of resistors R16 and R17 to supply a desired voltage level to an "adjusted" output of the IC 108. The voltage level $V_{in}$ that exists between the resistor R10 and the fuse F1 is supplied to the four manual keys 13-16 of FIG. 1.

The power supply circuit can be turned off by the microprocessor 20 by sending a low signal to the POWER signal 21b after the On/Off key 11 has been pressed or after the testing unit 5 has been on for two minutes with no activity. When the On/Off key 11 is pressed while the power supply is on, the resulting change in the ON_SW signal 11a is sensed by the microprocessor 20, which responds by producing a low POWER signal 21b. This turns off the transistor T11, which turns off the power supply.

Figure 6:
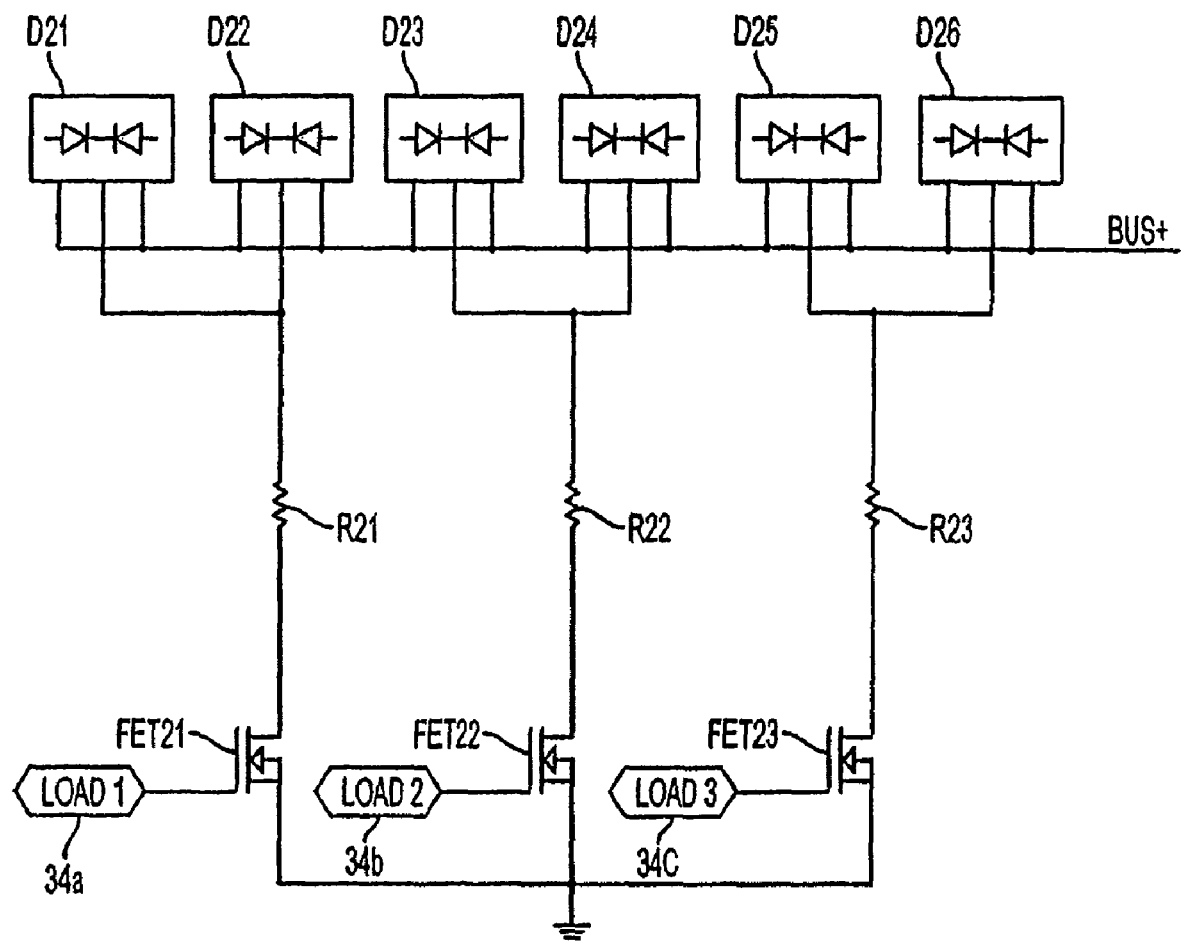
FIG. 6 is a circuit diagram of a load circuit used in the testing unit of FIG. 2.

Referring now to FIG. 6, illustrating a circuit diagram of the load circuit 28. The load circuit 28 comprises three parallel resistors R21, R22, and R23, each of which can be connected to the battery/system B under test by its own separate signal LOAD1 34a, LOAD2 34b, or LOAD3 34c which turns on a corresponding switching FET 21, 22, or 23, so that current can flow from the battery/system B under test through reverse blocking diodes D21-D26 and one or more of the resistors R21-R23 to ground. As will be described in more detail below, the load circuit 28 is connected to the battery/system B under test when it is desired to load test the battery/system B to evaluate its condition.

Figure 7:
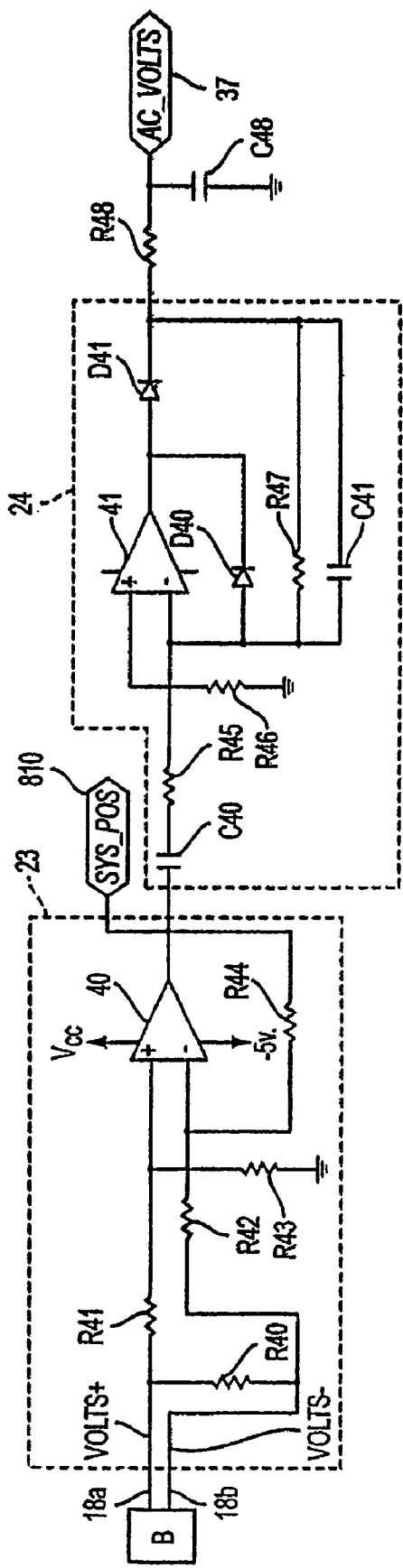
FIG. 7 is a circuit diagram of an analog conditioning and alternating current amplifier/rectifier circuit used in the testing unit of FIG. 2.

Referring now to FIG. 7, illustrating the analog conditioning circuit 23 and the AC amplifier/rectifier circuit 24 of FIG. 2. The analog conditioning circuit 23 is connected to terminals or posts of the battery/system B under test for measuring voltage across these posts. The connections to the battery/system B terminals are made with kelvin clamps 35a and 35b on the ends of the load leads 18a and 18b extending from the lower end of the testing unit 5. The VOLTS+ 811 input to the analog conditioning circuit 23 is derived from the small conductor of the positive load lead 118a, while the VOLTS− 812 input is derived from the small conductor of the negative load lead 18b. A pull-down resistor R40 is connected between the two load leads 18a and 18b.

The VOLTS+ 811 and VOLTS− 812 inputs are connected to the positive and negative inputs of an operational amplifier 40 via gain-setting resistors R41-R44 in a differential amplifier configuration. An output of the operational amplifier 40 furnishes the analog SYS-POS output voltage 810 (also shown in FIG. 3a) that represents an output voltage measuring voltage across the load leads 18a and 18b. This SYS_POS output voltage 810 is one of the inputs to the microprocessor 20 and its internal A/D converter 27.

Still referring to FIG. 7, the SYS_POS output voltage 810 of the operational amplifier 40 is also supplied through an AC coupling capacitor C40 to the AC amplifier/rectifier circuit 24 to produce a DC output representing a magnitude of any AC ripple in the battery voltage. (An AC ripple is associated with an AC component of the DC voltage derived from the battery, and typically originates from the alternator.) The capacitor C40 is connected through a gain-setting resistor R45 to the negative input of an operational amplifier 41 whose positive input is connected to a pull-down resistor R46. The output of the operational amplifier 41 is connected to a pair of rectifying diodes D40 and D41, which prevent a negative voltage from going into the microprocessor 20 and its internal A/D converter 27. An integrating capacitor C41 is connected in parallel with the two diodes D40 and D41, and a lowpass filter comprising a resistor R48 and a capacitor C48 is included to filter the signal. The resulting DC output of the AC amplifier/rectifier circuit 24 furnishes an AC_VOLTS output 37 that represents the magnitude of an AC ripple and is one of the inputs to the microprocessor 20.

Figure 8:
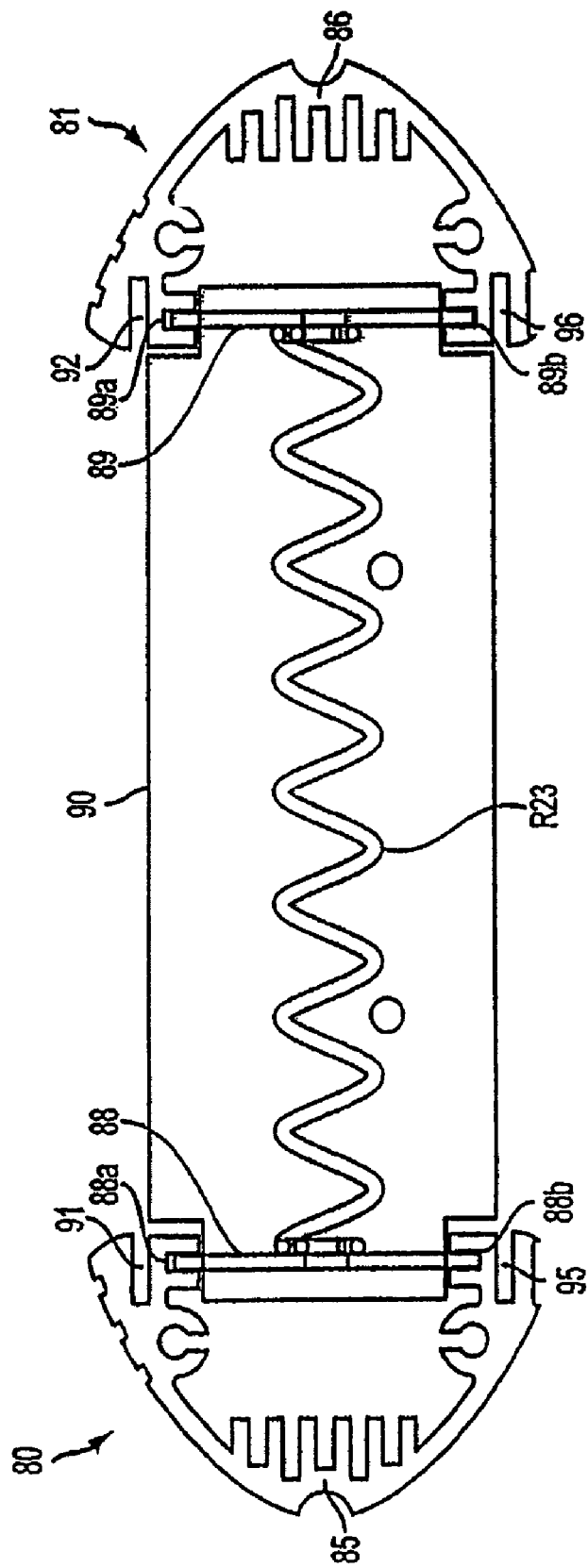
FIG. 8 is a sectional view taken transversely through an upper half of the testing unit of FIG. 1.

Referring now to FIG. 8, illustrating a sectional view of the upper half of the tester. Structurally, the testing unit 5 of FIG. 1 includes a strong, durable housing formed by a pair of extruded aluminum side members 80 and 81 (see FIGS. 1, 22, 8, and 21) joined at opposite ends by a pair of end plates 82 and 83 attached to the side members 80, 81 by multiple screws 84 (see FIGS. 1 and 20). Interior surfaces of the two side members 80, 81 form a first set of elongated slots 85 and 86 (FIG. 22) for receiving and supporting a printed circuit board 87 that carries all the electronic circuitry except for the three large resistors R21-R23 of the load circuit 28 (of FIG. 6) that form the high-current load for the battery under test. Because of the high current levels, these resistors R21-R23 dissipate a substantial amount of heat, and thus they are mounted in a ventilated end portion of the housing away from the printed circuit board 87. The ends of the three resistors R21-R23 are connected to a pair of insulating mounting plates 88 and 89 that fit into mating slots 88a, 88b and 89a, 89b formed in the interior surfaces of the respective side members 80, 81 (see FIG. 8). A third plate 90 extends across the upper end of the printed circuit board 87 and overlaps the lower ends of the insulating mounting plates 88 and 89. The insulating mounting plates 88, 89 and the third plate 90 combine to form an effective heat shield from the heat dissipated in the resistors R21-R23 during high-current load testing of the battery/system B under test.

Figure 9:
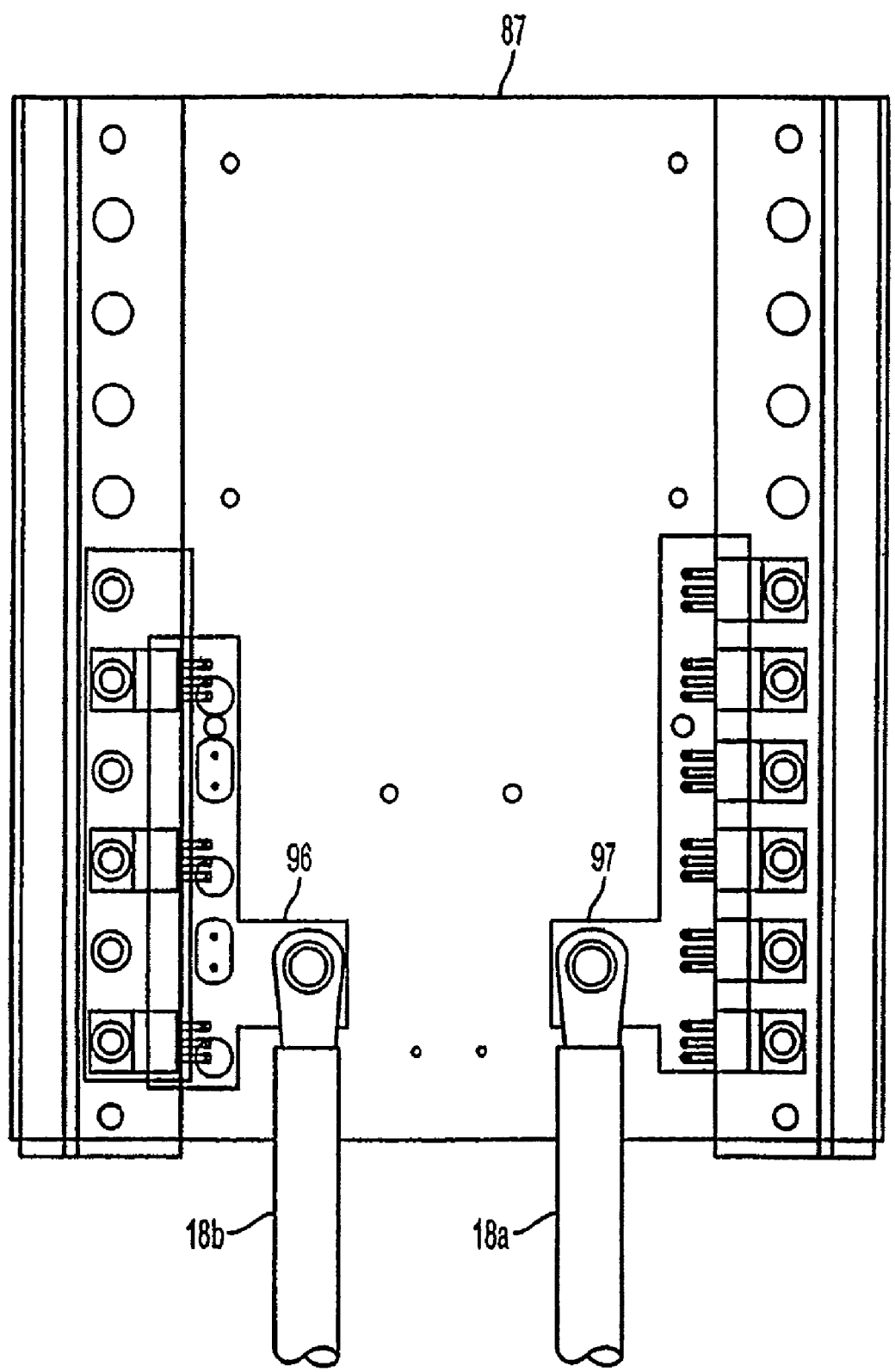
FIG. 9 is a bottom plan view of a printed circuit board used in the testing unit.
Figure 11:
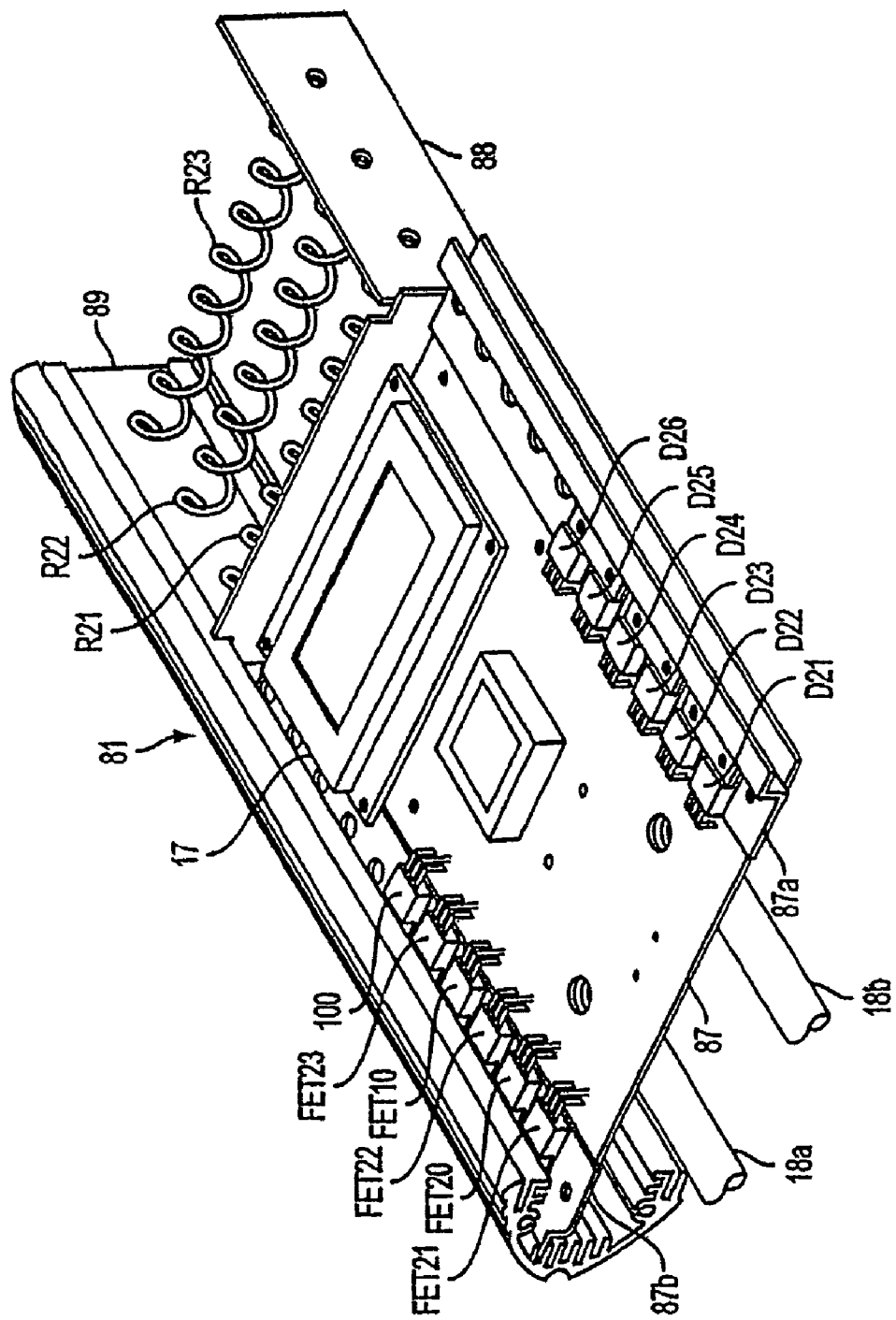
FIG. 11 is a perspective front view of an internal structure of the testing unit of FIG. 1, showing a top surface of a printed circuit board and a side wall of a housing.

Referring now to FIGS. 9 and 11, illustrating the printed circuit board 87 carrying two rows of TO-220 packaged devices, including switching transistors FET10, FET20, FET21-23, a voltage regulator 100, and diodes D21-D26, mounted along opposite edges of the printed circuit board 87. These TO-220 packaged devices are mounted on a pair of aluminum strips 87a and 87b that overlap the edge portions of the printed circuit board 87 and extend into mating slots in the side members 80 and 81 (see FIG. 18) to assist in dissipating heat from the components, especially when the load circuit 28 (of FIG. 2) is utilized.

The load leads 18a and 18b that connect the testing unit 5 to the battery/system B are connected to copper plates 96 and 97 near the lower end of the printed circuit board 87, as can be seen in FIG. 9. These copper plates 96 and 97 mount to the back of the printed circuit board 87 and carry the high current that flows through the diodes D21-26, the loads R21-23 and the transistors FET21-23 to the load leads 18a and 18b. These copper plates 96 and 97 permit the use of small components such as the TO-220 packaged devices, despite the high current levels.

Figure 10:
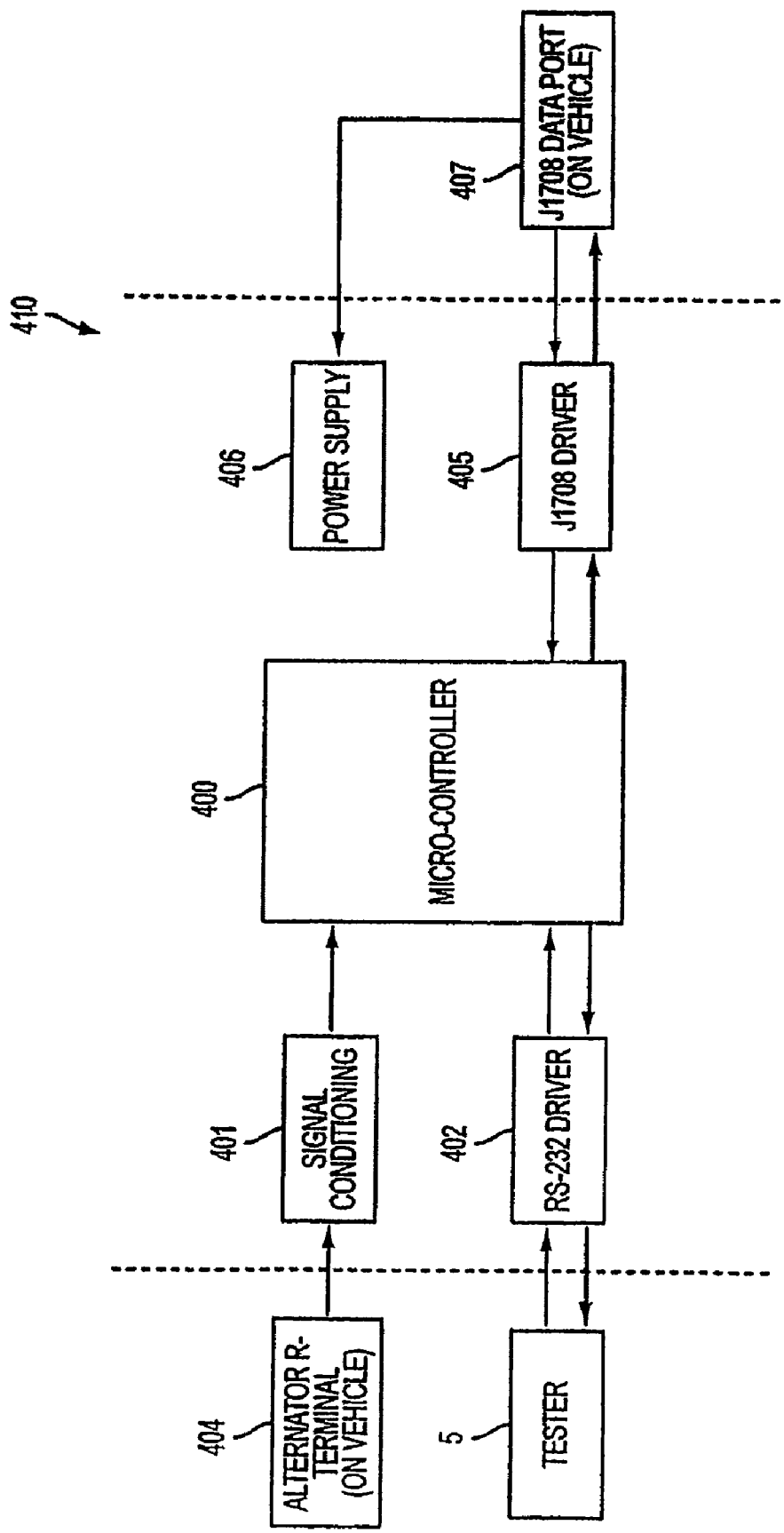
FIG. 10 is a block diagram illustrating the connections between a vehicle data port, the tester and an alternator.

FIG. 10 illustrates an embodiment depicting the hardware of the data cable 410 of the invention. The cable hardware 410 is controlled by a micro-controller 400. The micro-controller communicates with the data port 407 of a vehicle via a cable driver 405 (shown as a J1708 driver) and with the testing unit 5 via the RS232 driver 402. The micro-controller 400 also reads the signal from the R-terminal 404 of the alternator after the signal has been conditioned by signal conditioning block 401 to be in the voltage and frequency range of the micro-controller 400. The micro-controller 400 and other electronics on the data cable 410 receive power from the power supply 406, which, in turn, is powered from the battery system B voltage via the data port 407.

Figure 12:
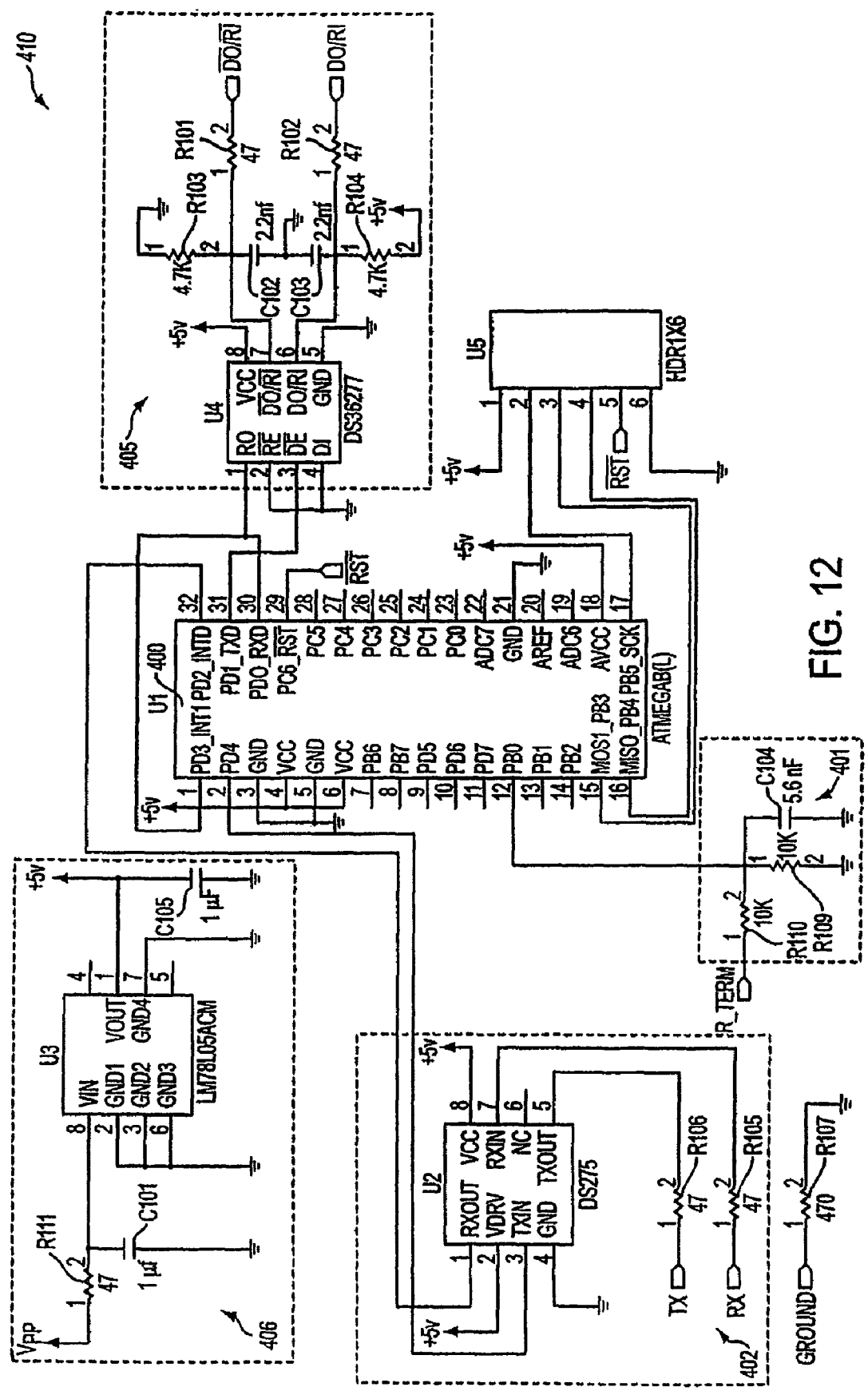
FIG. 12 illustrates a schematic diagram of the data port cable of the invention.

FIG. 12 illustrates a schematic of an exemplary embodiment of the data cable 410 of the invention. The micro-controller 400 labeled U1 is located in the center of the schematic. The J1708 driver 405 includes U4 (a commercially available J1708 driver) and the resistor/capacitor network consisting of resistors R101, R102, R103, R104, and capacitors C102 and C103. This is a common exemplary network arrangement used when interfacing to a data port 410. The four connections to the data cable are VPP, DO/RI, DO/RI, and ground denoted by the ground signal. The power supply 406 comprising U3 (a common voltage regulator), resistor R111, and capacitors C101 and C105 receives power via the VPP and ground connections of the data port 407.

Resistor R111 drops the voltage so that less power is dissipated in the voltage regulator U3. Capacitors C101 and C105 are filter capacitors. The RS-232 driver 402 includes U2 (a commercially available RS-232 driver) and resistors R105 and R106. Resistors R105 and R106 limit the current and protect the RS-232 driver 402 in the event of a connection error or short circuit. The signal conditioning circuitry 401 for the signal from the R-terminal includes resistor R109, R110 and capacitor C104. Resistors R109 and R110 form a voltage divider to attenuate the signal. Capacitor C104 in conjunction with R110 form a low pass filter that filters out high frequency noise. Resistor R107 connects the ground of the cable to the ground of the testing unit 5 via the RS-232 port. Resistor R107 prevents high current from flowing through the cable when the ground, on the vehicle, is faulty. U5 (part HDR1X6) allows a programmer to connect to the micro-controller 410 in order to program it during manufacturing.

Figure 13:
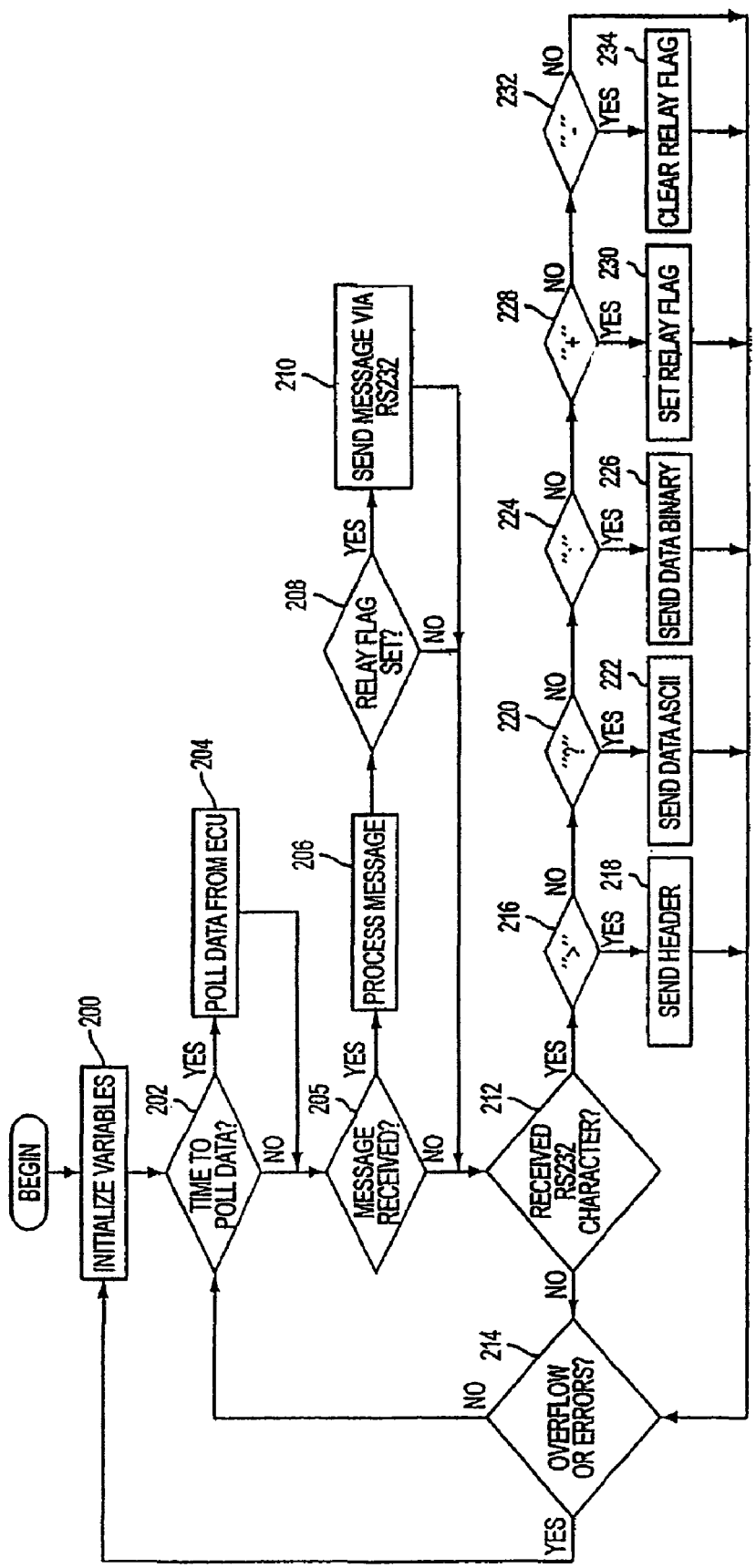
FIG. 13 illustrates an exemplary data port cable firmware of the invention.

FIG. 13 illustrates an exemplary operation of the data cable 410 firmware. The firmware for the data cable 410 first initializes internal variables and hardware (step 200), which is common in the art of micro-controller programming. Next, in steps 202, 205, 212 and 214, the firmware enters a loop where it checks if it is time to poll data on the data port (step 202), if a message has been received from the data port 407 (step 205), if a character has been received on the RS-232 port (step 212), if there has been an overflow or an error condition (step 214) and then repeats the loop. If it is time to poll data (step 202), the firmware sends out a request on the data port 407 (step 204). If a message has been received on the data port 407 (step 205), the firmware will process the message and extract the data from the message (step 206). After the message has been processed, if the relay flag is set (step 208), the controller will relay or send the message via the RS-232 port (step 210) and return to the main loop. This loop (steps 205, 206, 208, 210) is mainly for troubleshooting and viewing activity.

In the illustrated embodiment, if a character has been received on the RS-232 port (step 212), the firmware will check to see if the character is one of the command characters (">", "?", ":", "+", "−") in steps 216, 220, 220, 224, 228 and 232. If the character is determined to be a ">" character (step 216), the firmware sends out the header identifying the data (step 218). If the character is a "?"(step 220), the firmware will send out the data in ASCII format (step 222). If the character is a ":" (step 224), the firmware will send out the data in binary format (step 226). If the character is a "+" (step 228), the firmware will set the relay flag (step 230). And if the character is a "−" (step 232), the firmware will reset the relay flag (step 234). The only character that the testing unit 5 sends to the cable is the ":" which requests the data in binary format (step 226). The other characters are used for trouble shooting and for monitoring the data and J1708 communications via a laptop or other PC. When connected to a laptop or PC, ">" can be used to display what each data value corresponds to, "?" can be used to display the current data values. "+" and "−" are used to enable and disable viewing of all J1708 data port activity, respectively. The final check in the loop is for errors or character buffer overflow on the data port 407 (step 214). If there has been an error or a buffer overflow the firmware reinitializes and starts the loop over again. Reading from and writing to the RS-232 serial communication port and reading from and writing to the data serial communication port and reading the frequency on the R-terminal input are performed by interrupts using techniques that are well known in the art.

As previously noted in a preferred embodiment, the testing unit 5 is operated with six keys denoted On/Off, Print, +/Up, −/Down, Y/Enter, and N/Esc. The unit is turned on by pressing the On/Off key and then turned off at anytime by pressing the On/Off key again.

Figure 14:
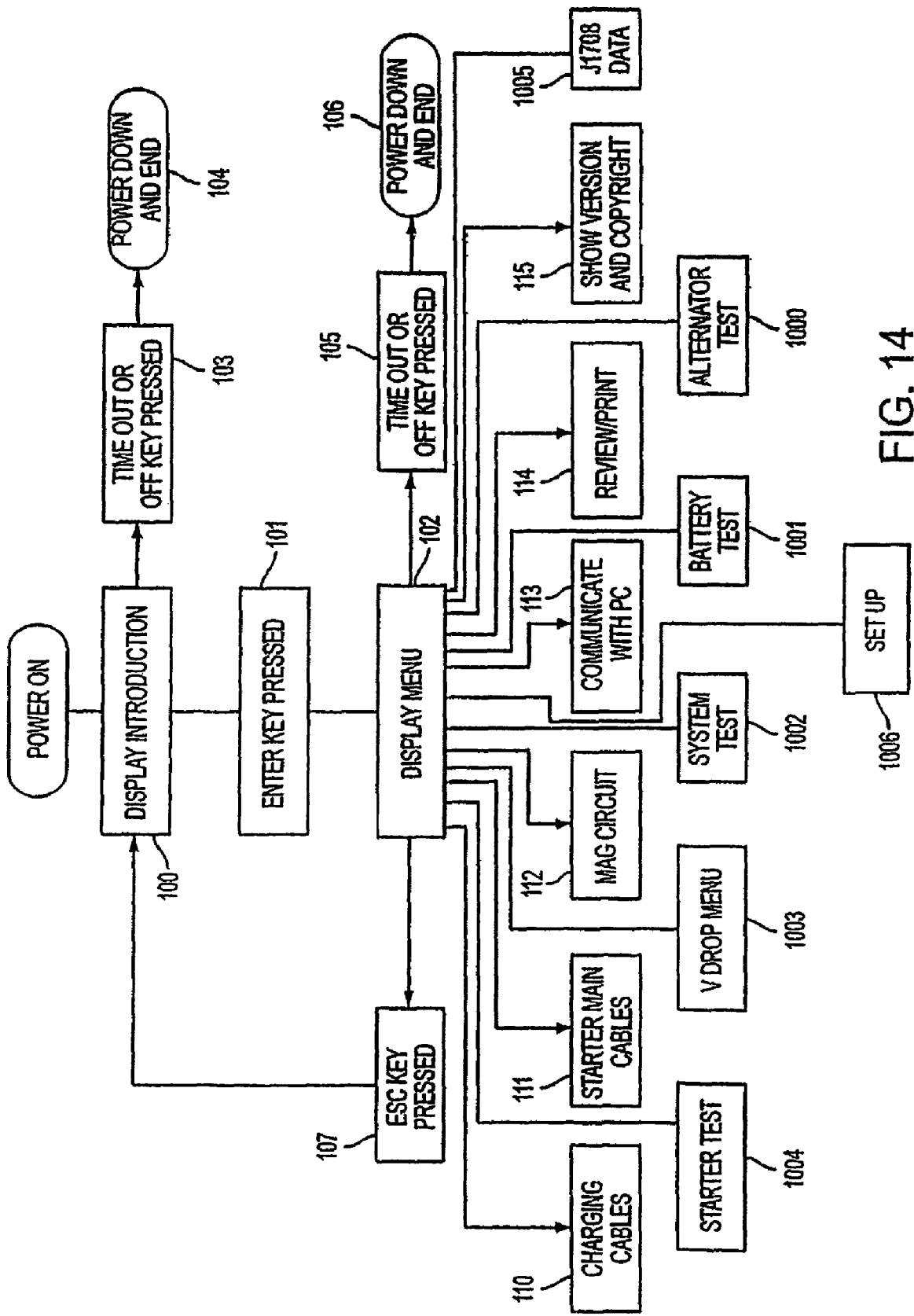
FIG. 14 is a flowchart of an exemplary program executed by the microprocessor to initiate operation of the testing unit.

FIG. 14 illustrates a flowchart depicting an exemplary software implementation on the above described testing unit 5 executed by the microprocessor 20, which is initiated when the microprocessor 20 detects that the power supply has been turned on. Referring also to FIG. 1, the first step 100 displays an introductory message on the LCD 17, informing the user to select "Y/Enter" to obtain a menu of options. If, at step 103, the "Y/Enter" key 15 is not pressed within a time-out interval measured by the microprocessor 20 or the On/Off key 11 is pressed, the system powers down, as indicated at step 104. If, at step 101, the Y/Enter key 15 is pressed, the program advances to step 102, where a menu is displayed to provide the user with an array of options. The options include testing the charging cables, starting main cables, magnetic switch circuit, alternator, battery, system, v-drop, and starter. Additional tester options include download, review/print, about, J1708 data, and setup. These options respectively correspond to subroutines 110-115, and 1000-1006 shown in FIG. 14.

Whenever the menu is displayed at step 102, the testing unit 5 waits for the user to select one of the options by pressing e.g., the +/Up key 13 or −/Down 14, to scroll to the desired option, and then pressing the Y/Enter key 15. Each selection calls one the routines 110-115 or 1000-1004. If, at step 105, it is detected that no option has been selected within a time-out interval measured by the microprocessor 20, or if the On/Off key 11 is pressed, the menu 102 is exited at step 106 and the testing unit powers down. The menu 102 may also be exited at 107, by pressing the N/Esc key 16 at any time during display of the introduction at step 100 or the options menu at step 102.

Any test results that are stored in memory, can be reviewed and printed by selecting the Review/Print menu item. The +/Up key 13 and the −/Down key 14 are used to scroll through the data. The Print key 12 is pressed to print the data via the infrared (IR) printer port.

When J1708 data is selected from the menu, real-time data is transferred from the vehicle to the testing unit 5 via the data cable 410 and is displayed on the screen. Two different screens of data can be displayed by pressing the +/Up 13 or −/Down 14 keys. The setup feature is used to configure the testing unit 5, set the time and date, and delete unwanted stored test results. The download option is used to download the stored test results and data to a PC via the RS-232 port. The About option displays the software version and copyright notice.

Figure 15:
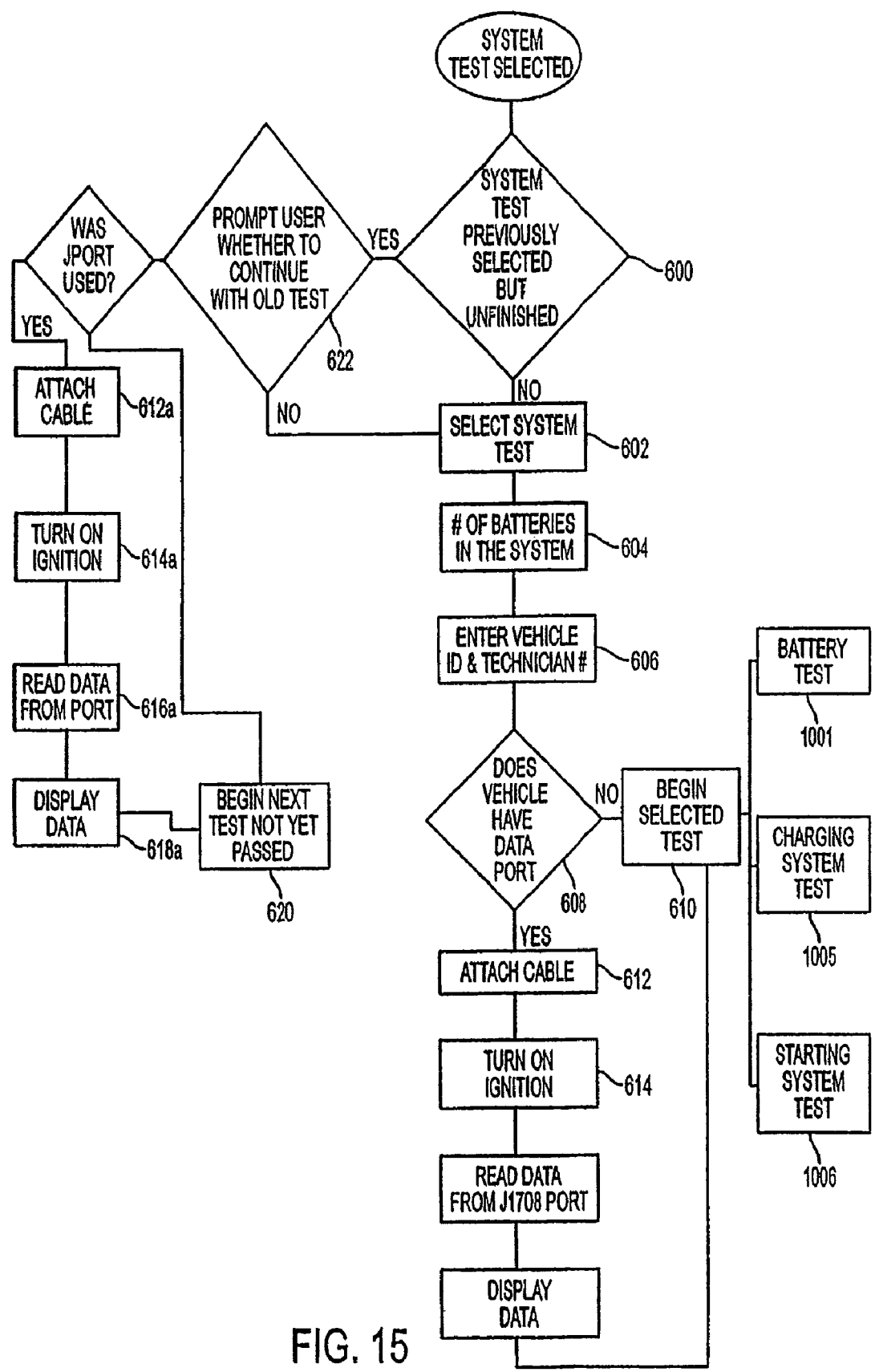
FIG. 15 is a flowchart of exemplary processing executed when a system test is selected.

FIG. 15 illustrates exemplary processing for carrying out a system test 1002. When the system test 1002 is selected from the main menu 102, and if a system test sequence was previously started but not completed (step 600), the testing unit 5 will prompt the operator to determine if the previous test sequence should be continued (step 622). If the previous test sequence is to be continued, the testing unit 5 will determine if the data cable or port was used (step 624). The previous test status and whether the data cable/port was used is stored in electrically erasable programmable read only memory (EEPROM) on the testing unit 5. If the data cable 410 was used (step 624), the testing unit 5 will prompt the operator to attach the cable 410 (step 612a). Once the data cable 410 is attached, the testing unit 5 prompts the operator to turn the ignition on (step 614a). After the engine has been started at step 614a, the data cable 410 reads data from the data port 407 (step 616a) and the testing unit 5 displays the data (step 618a). In one embodiment, in order to continue the operator presses the Y/Enter key 15. If the data cable was not used in the previous test (step 624), the testing unit 5 skips to the next test that has not passed (step 620).

At step 602, if the previous test sequence is not to be continued, the testing unit 5 prompts the operator to select the system to test. The operator may choose to test the battery, charging, or starting system. At step 604 the operator is prompted to select the number of batteries in the system. In a preferred embodiment, the operator is prompted, at step 606, to enter a vehicle ID number and technician number. At step 608, the operator is prompted to select whether the vehicle has a data port 407. If the vehicle does not have a data port 407, then the testing unit 5 skips to the selected system test (step 610). If the vehicle has a data port 407, the unit will prompt the operator (steps 612 and 614) to attach the data cable 410 and turn the ignition on. The data cable 410 reads the data from the data port 407 (step 616) and displays the data on the screen (step 618). In a preferred embodiment, the operator presses the Y/Enter key 15 to continue on to the selected test.

In FIG. 14, if the battery system is to be tested, the testing unit 5 will proceed to the battery bank test 1001. If the battery bank test passes, then the battery system test is finished, otherwise each battery is tested separately. If the charging system test is selected, the testing unit 5 will first perform a battery bank test 1001 and if the battery bank test fails, each battery is tested separately. Once the batteries are determined to be good, the charging cables 110 are tested. After the cables are determined to be good, the unit 5 tests the alternator 1000. In the starting system test 1006, a battery bank test 1001 is performed first. If the battery bank test fails, each battery is tested separately. After all of the batteries are determine to be good, the magnetic circuit is tested 112, followed by the starter main cables 111. Only after the batteries, magnetic circuit and started cables are determined to be good (i.e., passed their respective tests), the starter 1004 is tested. The battery test performed on the individual batteries when the bank test fails is described in U.S. Pat. No. 6,359,442, hereby incorporated by reference.

Figure 16:
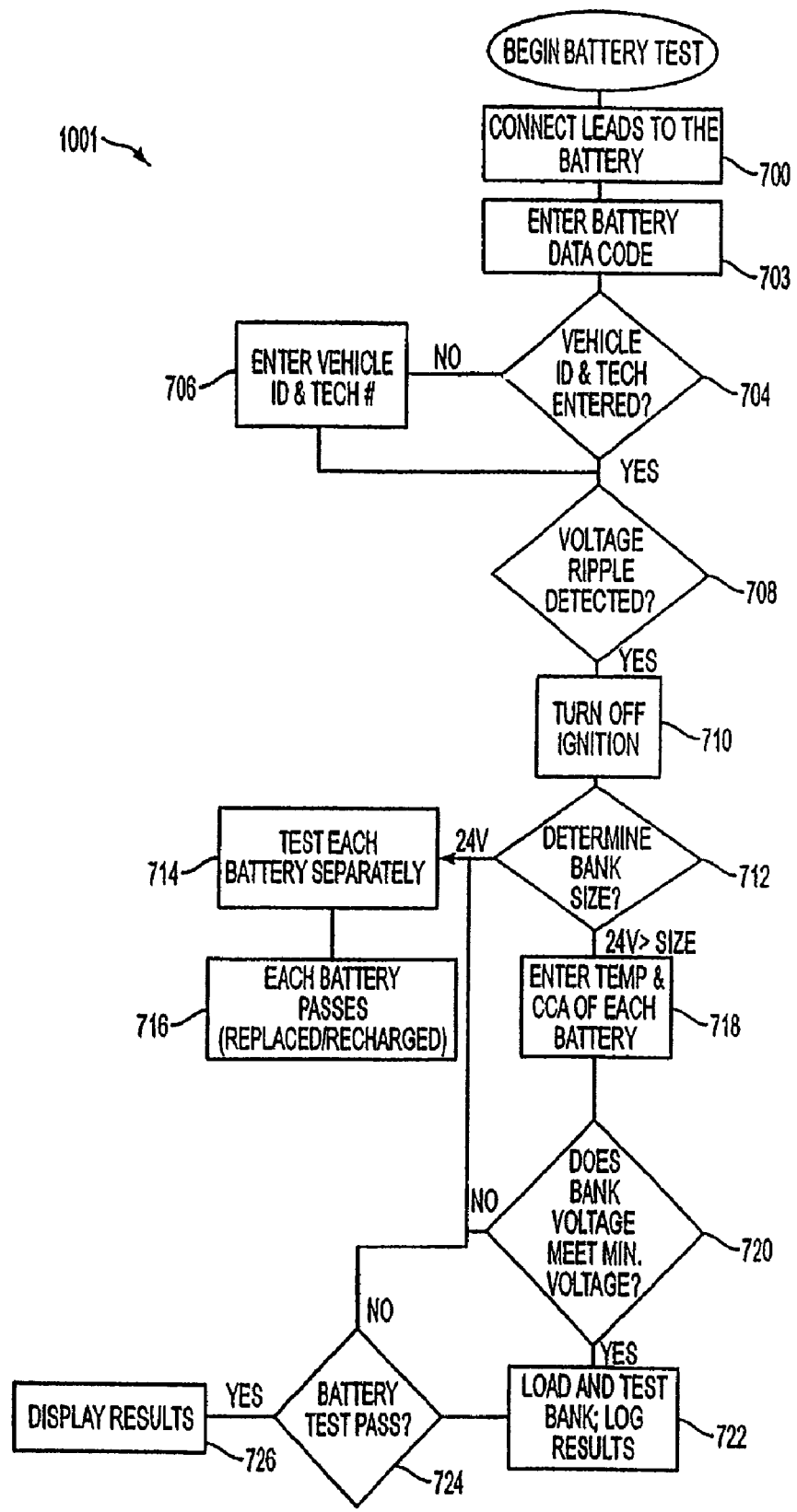
FIG. 16 is a flowchart of exemplary processing performed during the battery test.

FIG. 16 illustrates exemplary processing performed to a bank of batteries. The battery bank 1001 test begins by prompting the operator to connect the large tester leads 18a, 18b to the battery bank (step 700). If the testing unit 5 is setup to require battery date codes, the testing unit 5 prompts for the battery date code to be entered (step 702). If the vehicle ID number and technician number have not previously been entered (step 704), and the testing unit 5 is setup to require them, the testing unit 5 prompts for the ID number and technician number to be entered (step 706). In the event that voltage ripple is detected on the large leads in step 708, the testing unit 5 prompts the operator to turn off the engine (step 710). When the engine is off and the ripple has decreased, the testing unit 5 determines if the battery bank is a 24-volt bank (step 712). After it is determined that the bank is a 24-volt system, the operator is prompted to test each battery separately (step 714). However, if the bank is a 12-volt bank, the operator will be prompted to enter the temperature and the CAA of an individual battery (step 718). The bank of batteries is tested to determine whether a minimum voltage is met (step 720). If the minimum voltage is met, the testing unit 5 will then load and test the bank to determine the condition of the bank. The battery condition results will be logged at step 722. If the bank passed the test, the results are displayed and the battery bank test 1001 is complete. If the bank did not pass at step 724, the operator is instructed to test each battery separately (step 714). To perform the individual battery tests, each battery is disconnected from the bank and tested. When it is determined that a battery is bad or low, it must be recharged or replaced and then tested again.

Before the load is applied, the voltage of the battery bank is tested in step 720 and if the voltage is above a minimum amount (i.e. 12.40 V), the unit applies the load to the battery bank at step 722. However, if the voltage is not above the minimum value, the batteries must be disconnected and tested separately. At the end of the load period, the unit measures the loaded voltage and subtracts it from the beginning voltage thereby calculating the voltage drop. The unit computes the maximum allowed drop at the given temperature for a two, three, or four battery bank and compares the voltage drop to the maximum allowed. If the drop exceeds the maximum allowed, the batteries must be tested separately, otherwise the bank passes the test.

The maximum allowed change in voltage for a two-battery bank is given by the formula:

$$0.90 + (70 - Temperature) \times 0.0027. \qquad (Eq. 1)$$

The maximum allowed change in voltage for a three-battery bank is given by the formula:

$$0.75 + (70 - Temperature) \times 0.0023. \qquad (Eq. 2)$$

The maximum allowed change in voltage for a four-battery bank is given by the formula:

$$0.60 + (70 - Temperature) \times 0.0018. \qquad (Eq. 3)$$

A similar formula would be constructed for testing a single remote battery. The formula is based on a temperature measured in degrees Fahrenheit.

Figure 17:
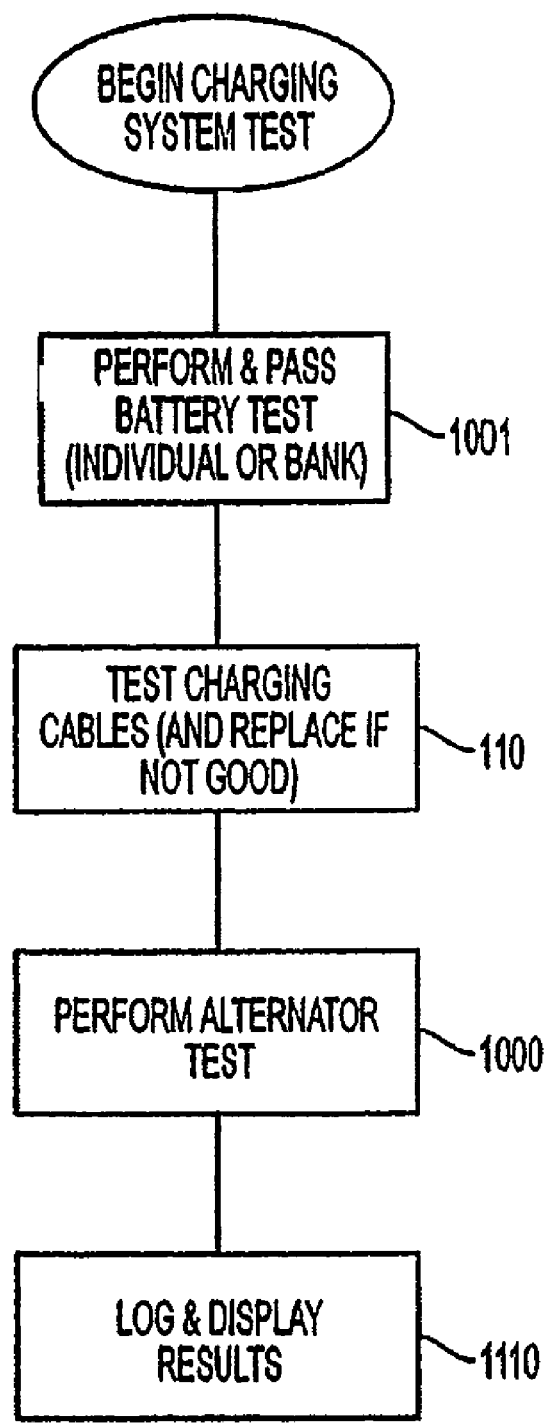
FIG. 17 is a flowchart illustrating exemplary steps performed while testing the charging system in accordance with the invention.

FIG. 17 illustrates the processing steps and the desired order for the steps for testing the charging system in accordance with the invention. The first test conducted in the charging system is of the bank of batteries 1001. Once the battery bank or the separate batteries have been determined to be good (i.e., pass) in step 1001, the charging cables are tested 110. The test conducted on the charging cables 110 is described in U.S. Pat. No. 6,771,073, hereby incorporated by reference. After it is determined that the charging cables are good, the alternator is tested 1000. Finally, the data is logged and the results are displayed in step 1110. The results include the condition of the alternator and whether the batteries and cables passed or were repaired.

Figure 18:
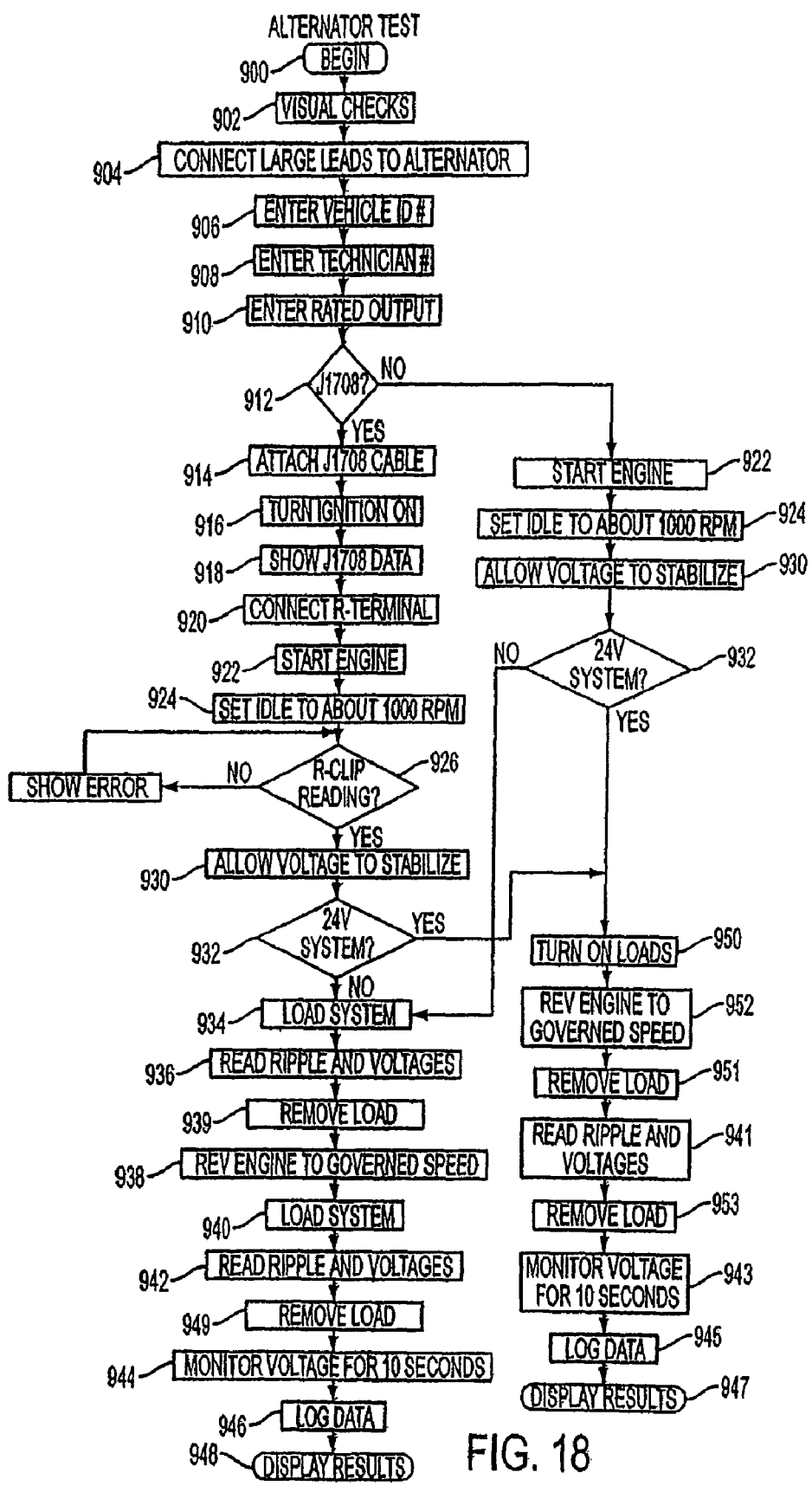
FIG. 18 is a flowchart illustrating exemplary steps performed during the alternator test in accordance with the invention.

FIG. 18 illustrates a flowchart of the exemplary processing performed during the alternator test 1000. The alternator test 1000 is the final test run when testing the charging system, however, the test 1000 can also be selected from the main menu as its own test. The alternator test 1000 begins by prompting the operator to perform a visual inspection of the alternator belt, cables and connections (step 902). The operator is instructed to connect the leads to the alternator (step 904). Next, if not previously entered, at steps 906 and 908 the testing unit 5 prompts the operator to enter a vehicle ID number and a technician number (in a preferred embodiment of the invention). If the ID and technician number were previously entered, the testing unit 5 retrieves the information from EEPROM (at either step 906 or 908). The testing unit 5 also prompts the operator to enter the rated output of the alternator (step 910). The testing unit 5 determines whether or not the vehicle has a data port 407 by checking EEPROM or by prompting the operator (step 912).

If the vehicle does not have a data port 407 (step 912), the testing unit 5 determines if the engine is running by reading the voltage ripple at the alternator. If ripple is detected, the engine must be running. However, if no ripple is detected, the operator is prompted to start the engine (step 916). After it is determined that the engine is running, the operator is instructed to idle the engine at about 1000 RPM (step 924). In step 930, the testing unit 5 displays the voltage at the alternator and instructs the operator to allow the voltage to stabilize, once the voltage has stopped rising the operator is to press the Y/Enter key 15.

However, if it is determined at step 912 that the vehicle has a data port 407, the testing unit 5 prompts the operator to attach the data cable 410 and turn the ignition on (steps 914 and 916). At this point, the data cable reads data from the vehicle's engine control unit (ECU) and the unit reads the data from the cable and displays it on the LCD screen (step 918). After the data is displayed, the operator is prompted to connect the R-Clip to the R-Terminal of the alternator (step 920). The R-terminal is a terminal on most heavy-duty alternators that outputs a square wave that has a frequency proportional to the rotational speed of the alternator. The testing unit 5 determines if the engine is running and if it is not, the testing unit prompts the operator to start the engine (step 922). Once the engine is running, the operator is instructed to idle the engine at about 1000 RPM (step 924). The testing unit 5 determines if the R-Clip is reading and reports an error if it is determined that the R-Clip is not reading (steps 926 and 928). The voltage at the alternator is displayed and the testing unit 5 instructs the operator to allow the voltage to stabilize, and to press the Y/Enter key 15 once the voltage has stopped rising in step 930.

After the user presses the Y/Enter key 15, both with the data cable 410 connected or without, the testing unit 5 determines whether the alternator is a 12-volt or a 24-volt alternator by reading the voltage (step 932). For a 24-volt alternator, the testing unit 5 prompts the operator to turn on accessory loads to load the alternator (step 950). The engine is revved to a governed speed and the ripple and voltages are read (steps 952 and 941). After each reading of the ripple and voltages, the load is removed (steps 951, 953. The voltage is monitored for 10 seconds, the results are logged and the data is displayed (steps 943, 945 and 947). In the hand-held embodiment of this invention, the testing unit 5 does not load a 24-volt alternator because additional or larger load elements would be required. In a larger embodiment, the testing unit 5 could automatically load the 24-volt alternator.

However, if the alternator being tested is a 12-volt alternator, the unit 5 automatically loads the alternator and reads the ripple and voltage (step 936) and then the load is removed (step 939). After the accessory loads are turned on or automatically loaded, the operator is prompted to rev the engine to governed speed for 10 seconds (step 938). The testing unit 5 reads the ripple and voltage produced by the alternator and then monitors the voltage for the 10 seconds (steps 942 and 944). The peak voltage is recorded. The testing unit 5 logs the data and displays the results (steps 946 and 948).

The data that may be collected and logged during the alternator test includes: rated alternator output, beginning voltage, loaded voltage, peak voltage at governed speed, ripple at idle, ripple at governed speed, R-Terminal frequency at idle (from cable), R-Terminal frequency at governed speed (from cable), engine RPM at idle (from ECU via the data port), engine RPM at governed speed (from ECU via the data port), time, date, vehicle ID, vehicle VIN (from ECU via the data port) and technician number.

From the data collected during the alternator test, several different determinations regarding the condition of the alternator can be made. For example, if the beginning voltage is below the minimum allowed voltage (e.g., 13.2V on a 12-volt system), the testing unit 5 reports that the alternator has low regulation. Or, if the peak voltage at governed speed is above the maximum allowed voltage (e.g., 14.8V on a 12-volt system), the unit 5 reports that the alternator has high regulation. Otherwise the testing unit 5 reports that the regulation is good. Additionally, if the ripple at idle is above the maximum allowed (e.g., 0.35VAC for a 12-volt system) or if the ripple at idle is above a lower maximum allowed (e.g., 0.25VAC for a 12-volt system) and increased to be over another maximum allowed (e.g., 0.26VAC for a 12-volt system) at governed speed, the testing unit 5 reports that the alternator has a bad diode. When the loaded voltage is below the minimum allowed voltage (e.g., 12.9V for a 12-volt system), the testing unit 5 reports that the alternator has low output.

If the data port 407 was used during the alternator test and the ratio of the engine RPM to the R-Terminal frequency at governed speed is greater than the ratio of the engine RPM to the R-Terminal frequency at idle by more that a set amount (e.g., 5%), the unit 5 reports that the alternator belt is slipping. Only when it is determined that the regulation is good, the ripple is low, the belt is not slipping and the output is good does the unit reports that the alternator is good.

Figure 19:
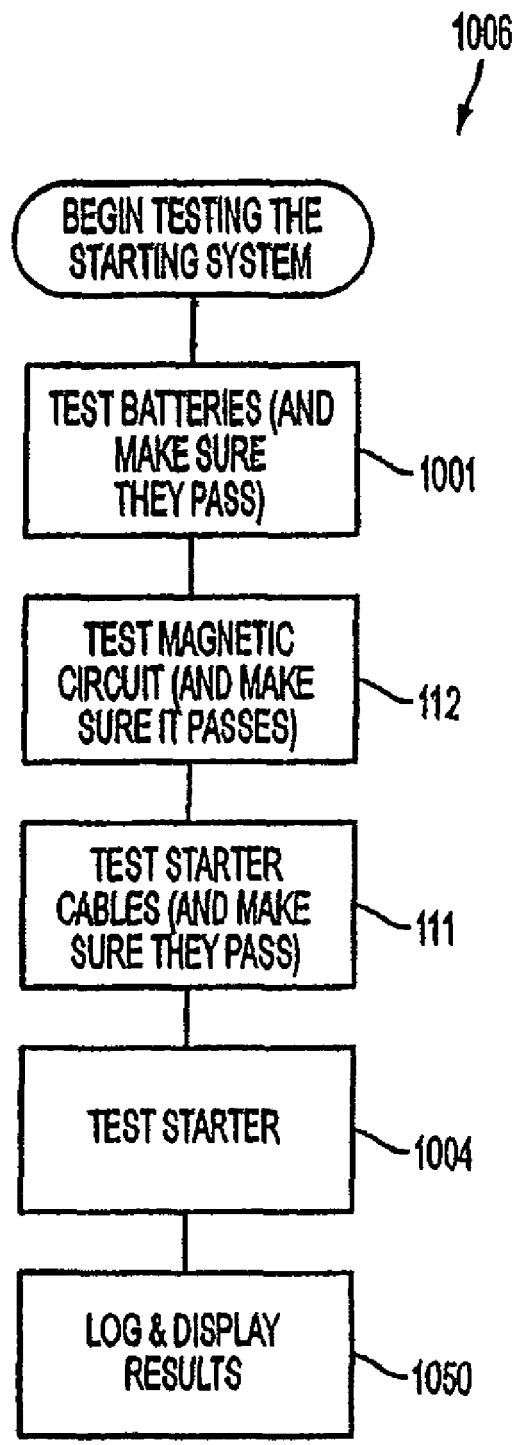
FIG. 19 is a flowchart illustrating an exemplary embodiment of the starting system test in accordance with the invention.

FIG. 19 illustrates exemplary tests that must be completed to carry out the starting system test 1006 in accordance with the invention. In testing the starting system 1006, several components must pass before the starter itself is tested. First, the bank of batteries is tested 1001. If the battery bank fails, the batteries are tested individually and each must be determined to be good. After the batteries have passed, the magnetic circuit is tested 112. The test 112 is based on the test described in U.S. Pat. No. 6,771,073, hereby incorporated by reference. However, a select starter function has been added to account for a new gear reduction starter that requires the magnetic circuit to handle 350 amps instead of only 80 amps. Once the magnetic circuit has passed, the starter main cables are tested 111. After it is determined that the starter main cables are good, the starter is tested 1004. The data is logged and the results are displayed 1050. The results include the condition of the starter and whether the batteries, the magnetic circuit and the cables passed or were repaired.

Figure 20:
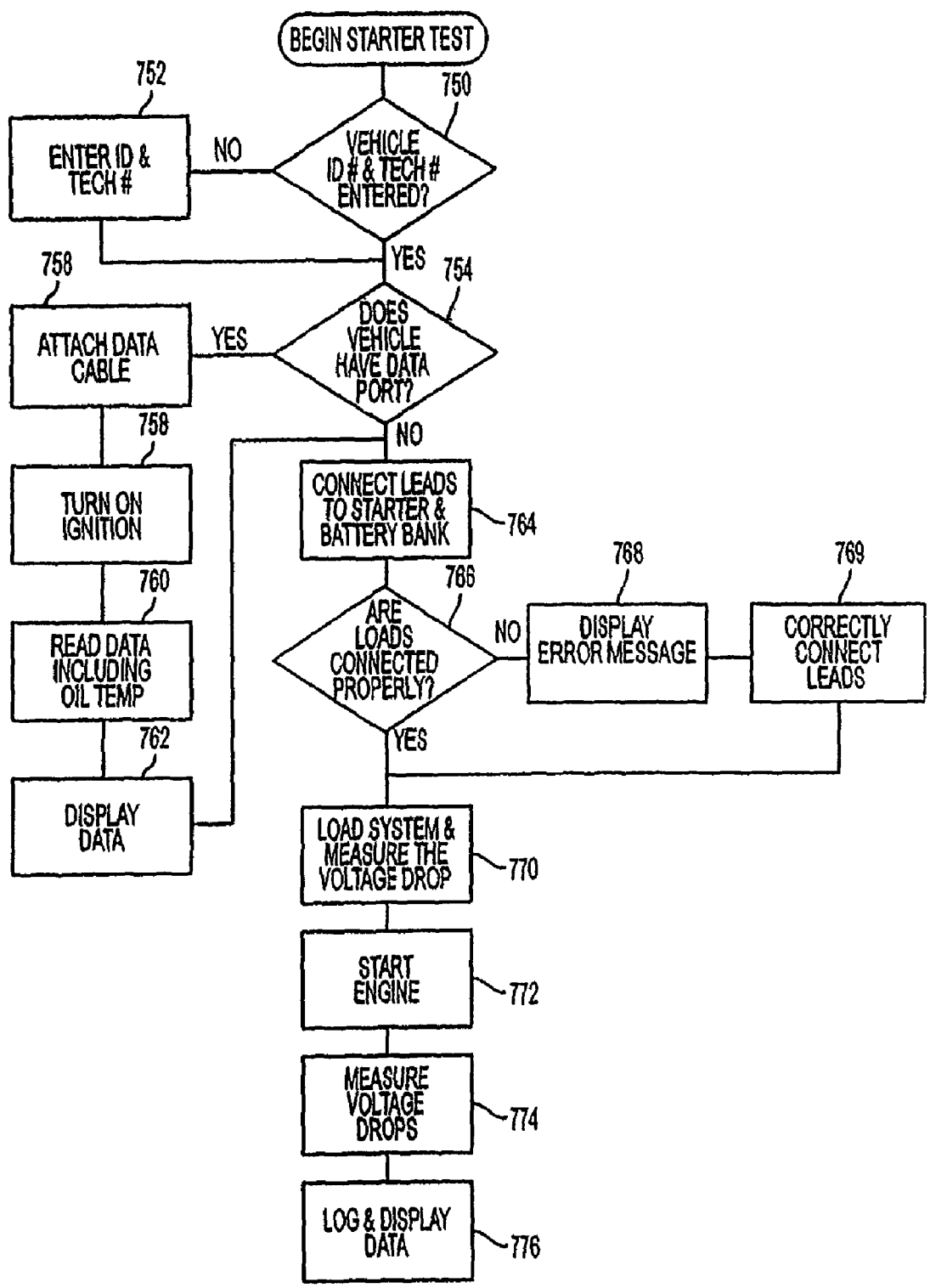
FIG. 20 is a flowchart illustrating an exemplary embodiment of the starter test in accordance with the invention.
Figure 21:
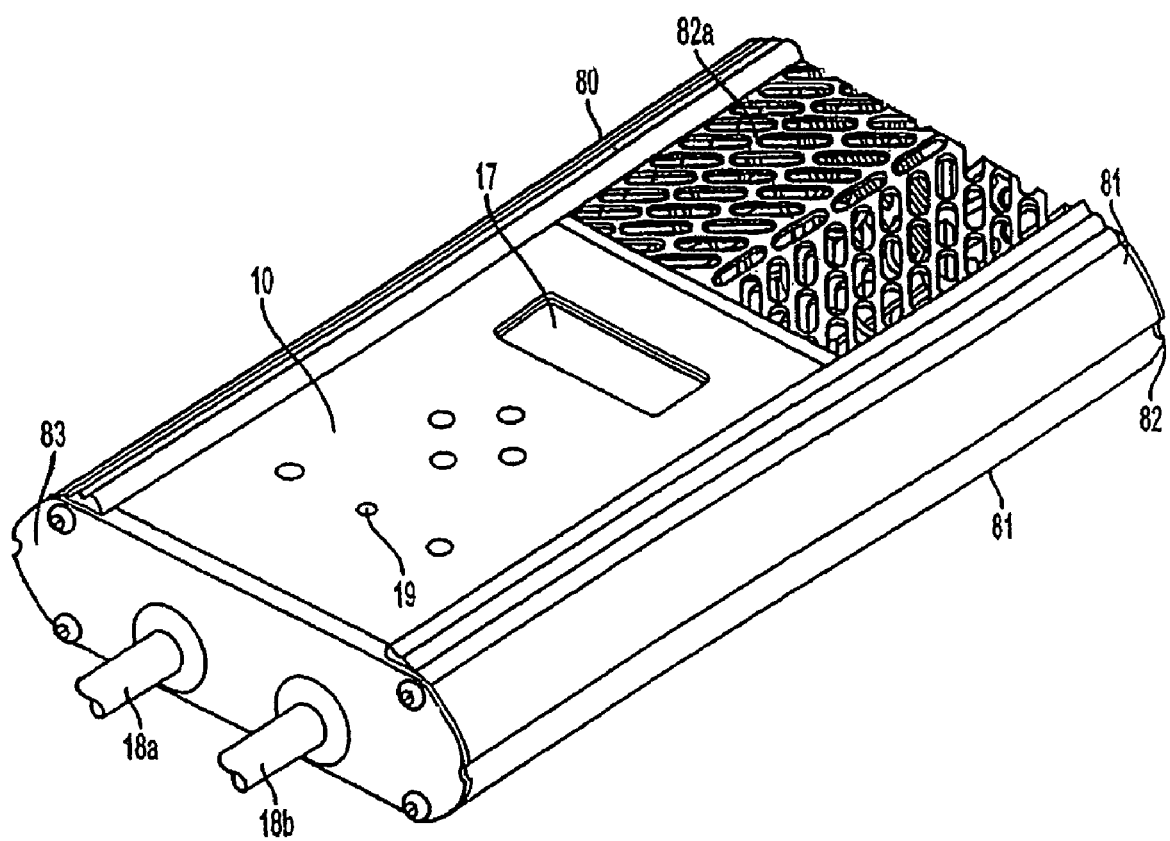
FIG. 21 is a perspective front view of an analyzer shown in FIG. 1 without keys, taken from a lower end of the testing unit of FIG. 1.
Figure 22:
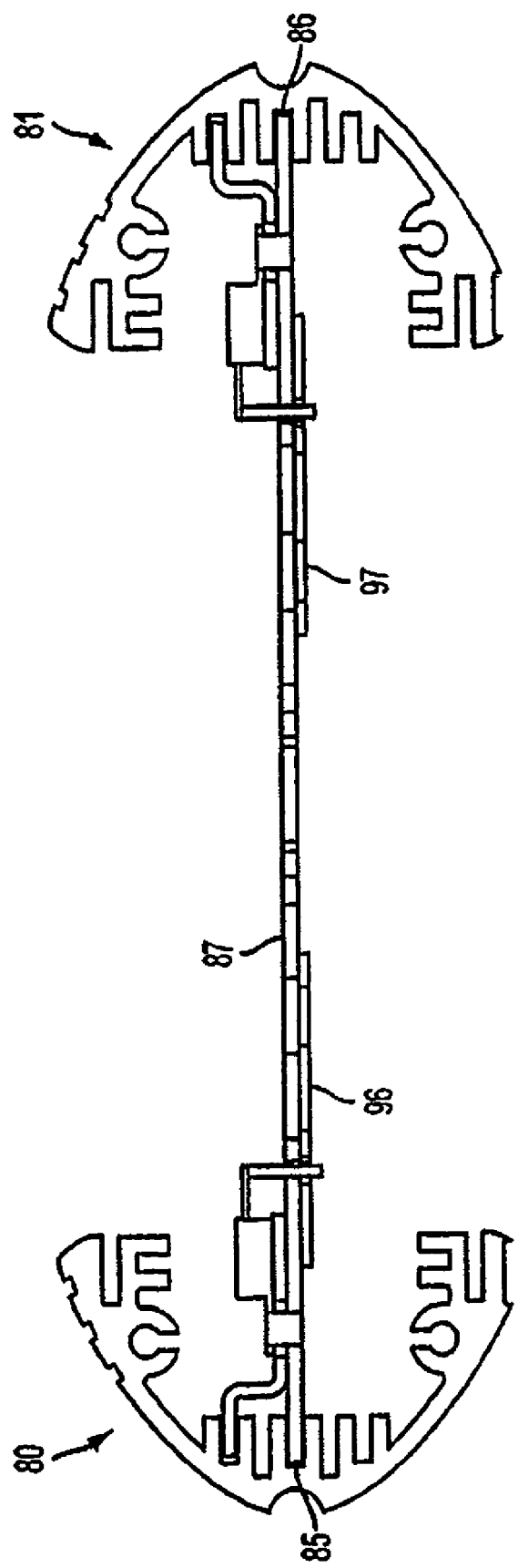
FIG. 22 is a sectional view taken transversely through a lower half of the testing unit shown in FIG. 1.

FIG. 20 illustrates exemplary processing performed by the starter test 1004 according to the invention. The starter test 1004 is the final test run when testing the starting system. The test 1004 can also be selected from the main menu as its own test. First, if not previously entered, the unit prompts the operator to enter a vehicle ID number and a technician number in step 750 (according to an embodiment of the invention). If these were previously entered, the testing unit 5 retrieves the information from EEPROM. It is then determined whether the vehicle has a data port 407 by checking EEPROM or by prompting the operator. If the vehicle has a data port 407, the testing unit 5 instructs the operator to attach the data cable 410 and turn the ignition on (steps 756 and 758). At this point, the data cable 410 reads data from the vehicle's ECU and the unit reads the data from the data cable 410 and displays it (steps 760 and 762). After the data is displayed (step 762), the operator is instructed to connect the large leads 18a, 18b to the starter and to connect the small leads 20a, 20b to the battery (step 764). The testing unit 5 verifies that the leads are connected properly (step 766). An error message is displayed if it is determined that the leads are not connected properly (step 768). After the leads are correctly connected (step 769), the unit loads the system and measures the voltage drops in the cables from the battery to the starter while the load current is flowing (step 770). In step 772, the operator is instructed to start the vehicle's engine. While the engine cranks, the unit measures the voltage at the starter and the voltage drops in the cables (step 774). The data is logged and results are displayed (step 776).

The data that may be collected and logged during the starter test includes: beginning voltage, loaded voltage, battery voltage, drop in positive cable under load, cranking voltage, drop in positive cable while cranking, starter current draw, oil temperature (from ECU via the data port), ambient temperature (from ECU via the data port), time, date, vehicle ID, vehicle VIN (from ECU via the data port), and technician number.

The starter current draw is determined by first determining the resistance of the positive cable. This is accomplished by loading the system at the starter with a load of known resistance. Ohm's law, I=V/R, gives the current the testing unit 5 pulls through the cable. Where V is the voltage at the testing unit 5 leads and R is the known resistance of the tester load. Next, the resistance of the positive cable is determined, again by using Ohm's law. Where V is the voltage drop across the positive cable and I is the current that the testing unit 5 pulled through the cable. Once the resistance of the positive cable is known, the current that the starter draw is determined, where V is the voltage drop across the cable while the starter is cranking and R is the resistance of the cable. The test of the starter cables is disclosed in U.S. Pat. No. 6,771,073, which is hereby incorporated by reference herein.

The colder the oil, the more power it takes to crank the engine. Excessive current draw can indicate a faulty starter. The data collected is used to determine if the current the starter draws exceeds an acceptable amount. The formula for the maximum current is a function of the oil temperature. If the data cable 410 was used, the testing unit 5 reads the engine oil temperature from the ECU. An exemplary formula used to calculate the current draw is:

$$1400-(\text{oil temperature} \times 4). \tag{Eq. 4}$$

Where the oil temperature is in degrees Fahrenheit. This formula is only exemplary and will likely be fine tuned as more data is collected.

At the conclusion of the test, the testing unit 5 reports the beginning voltage, the cranking voltage, the starter draw and if the data cable 410 was used. The testing unit 5 also reports the engine oil temperature and the condition of the starter.

The data read from the data port 407 and sent to the testing unit 5 via the RS-232 may include the ignition switch position (PID 43), pedal position (PID 91), battery voltage (PID 168), ambient temperature (PID 171), oil temperature (PID 175), engine speed (PID 190), VIN (PID 237), clock (PID 251), and date (PID 252). PID stands for parameter identifier. The PID format and assignments are documented in SAE document J1587.

The processes and devices described above illustrate exemplary methods and devices of many that could be used to implement the invention. The above description and drawings illustrate exemplary embodiments of the present invention. It should be appreciated that the values used to describe the above identified embodiments are only exemplary. However, it is not intended that the present invention be strictly limited to the above-described and illustrated embodiments and is only limited by the scope of the appended claims.

What is claimed as new and desired to be protected by Letters Patent of the United States is:

The invention claimed is:

1. A method of testing a bank of batteries of a vehicle, comprising:
   measuring a voltage of a bank of batteries, each battery of the bank of batteries comprising a plurality of cells;
   comparing said measured voltage to a threshold voltage;
   applying a load to the bank of batteries if said measured voltage is greater than said threshold voltage;
   measuring the voltage of the bank of batteries while the load is being applied;
   comparing the change in voltage of the battery bank to a voltage drop maximum threshold, wherein the voltage drop maximum threshold is based on the number and temperature of batteries in the bank of batteries; and
   determining whether said bank of batteries passes the test based on said change in voltage, wherein if it is determined that the bank of batteries fails the test, said method further comprises:
testing each individual battery; and
charging said batteries until it is determined that said battery bank passes.

2. A method of testing a bank of batteries of a vehicle, comprising:
measuring a voltage of a bank of batteries;
comparing said measured voltage to a threshold voltage;
applying a load to the bank of batteries if said measured voltage is greater than said threshold voltage;
measuring the voltage of the bank of batteries while the load is being applied;
comparing the change in voltage of the battery bank to a voltage drop maximum threshold, wherein the voltage drop maximum threshold is based on the number and temperature of batteries in the bank of batteries;
determining whether said bank of batteries passes the test based on said change in voltage; and
calculating said voltage drop maximum threshold when said bank of batteries has two batteries using the equation: $0.9+(70-\text{Temperature})\times 0.0027$.

3. A method of testing a bank of batteries of a vehicle, comprising:
measuring a voltage of a bank of batteries;
comparing said measured voltage to a threshold voltage;
applying a load to the bank of batteries if said measured voltage is greater than said threshold voltage;
measuring the voltage of the bank of batteries while the load is being applied;
comparing the change in voltage of the battery bank to a voltage drop maximum threshold, wherein the voltage drop maximum threshold is based on the number and temperature of batteries in the bank of batteries;
determining whether said bank of batteries passes the test based on said change in voltage; and
calculating said voltage drop maximum threshold when said bank of batteries has three batteries using the equation: $0.75+(70-\text{Temperature})\times 0.0023$.

4. A method of testing a bank of batteries of a vehicle, comprising:
measuring a voltage of a bank of batteries;
comparing said measured voltage to a threshold voltage;
applying a load to the bank of batteries if said measured voltage is greater than said threshold voltage;
measuring the voltage of the bank of batteries while the load is being applied;
comparing the change in voltage of the battery bank to a voltage drop maximum threshold, wherein the voltage drop maximum threshold is based on the number and temperature of batteries in the bank of batteries;
determining whether said bank of batteries passes the test based on said change in voltage; and
calculating said voltage drop maximum threshold when said bank of batteries has four batteries using the equation: $0.6+(70-\text{Temperature})\times 0.0018$.

* * * * *